(12) United States Patent
Shim et al.

(10) Patent No.: US 12,230,617 B2
(45) Date of Patent: Feb. 18, 2025

(54) DISPLAY DEVICE USING MICRO-LED, AND MANUFACTURING METHOD THEREFOR

(71) Applicant: LG ELECTRONICS INC., Seoul (KR)

(72) Inventors: Bongchu Shim, Seoul (KR); Dohee Kim, Seoul (KR); Yongil Shin, Seoul (KR); Dohwan Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 583 days.

(21) Appl. No.: 17/616,125

(22) PCT Filed: Jun. 11, 2019

(86) PCT No.: PCT/KR2019/006994
§ 371 (c)(1),
(2) Date: Dec. 2, 2021

(87) PCT Pub. No.: WO2020/251070
PCT Pub. Date: Dec. 17, 2020

(65) Prior Publication Data
US 2022/0246593 A1 Aug. 4, 2022

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/83* (2013.01); *H01L 24/95* (2013.01); *H01L 27/1259* (2013.01); *H01L 33/0093* (2020.05); *H01L 24/24* (2013.01); *H01L 24/29* (2013.01); *H01L 24/32* (2013.01); *H01L 24/73* (2013.01); *H01L 33/20* (2013.01); *H01L 33/32* (2013.01);
(Continued)

(58) Field of Classification Search
None
See application file for complete search history.

(56) References Cited

U.S. PATENT DOCUMENTS

| | | |
|---|---|---|
| 2013/0168708 A1 | 7/2013 | Shibata et al. |
| 2013/0241302 A1 | 9/2013 | Miyamoto et al. |

(Continued)

FOREIGN PATENT DOCUMENTS

| | | | | |
|---|---|---|---|---|
| CN | 107910413 A | * | 4/2018 | ......... H01L 33/0079 |
| CN | 109950182 A | * | 6/2019 | ......... H01L 21/6835 |

(Continued)

*Primary Examiner* — Robert K Carpenter
(74) *Attorney, Agent, or Firm* — Birch, Stewart, Kolasch & Birch, LLP

(57) ABSTRACT

A method for manufacturing a display device can include forming an assembly electrode on a substrate; applying an insulating layer on the assembly electrode; disposing a partition wall on the insulating layer; defining an assembly groove in the partition wall; providing an light emitting diode (LED) having an assembly face corresponding to a shape of the assembly groove in the partition wall; and assembling the assembly face of the LED into the assembly groove in the partition wall, in which the LED includes a first electrode, a first semiconductor layer, an active layer, a second semiconductor layer, and a second electrode stacked in a first direction to form a stacked structure.

16 Claims, 22 Drawing Sheets

(51) Int. Cl.
*H01L 27/12* (2006.01)
*H01L 33/00* (2010.01)
*H01L 33/20* (2010.01)
*H01L 33/32* (2010.01)

(52) U.S. Cl.
CPC .............. *H01L 2224/24051* (2013.01); *H01L 2224/24105* (2013.01); *H01L 2224/24147* (2013.01); *H01L 2224/29006* (2013.01); *H01L 2224/32013* (2013.01); *H01L 2224/32058* (2013.01); *H01L 2224/32148* (2013.01); *H01L 2224/73204* (2013.01); *H01L 2224/83201* (2013.01); *H01L 2224/95101* (2013.01); *H01L 2224/95133* (2013.01); *H01L 2224/95136* (2013.01)

(56) References Cited

U.S. PATENT DOCUMENTS

| | | | |
|---|---|---|---|
| 2017/0133558 | A1 | 5/2017 | Sasaki et al. |
| 2018/0102352 | A1 | 4/2018 | Sasaki et al. |
| 2018/0240937 | A1 | 8/2018 | Park et al. |
| 2019/0115513 | A1 | 4/2019 | Im et al. |

FOREIGN PATENT DOCUMENTS

| | | | | |
|---|---|---|---|---|
| CN | 110047785 A | * | 7/2019 | |
| JP | 9-289338 A | | 11/1997 | |
| JP | 2003216052 A | * | 7/2003 | ............. H01L 24/95 |
| JP | 2006-140398 A | | 6/2006 | |
| JP | 2013-4792 A | | 1/2013 | |
| KR | 10-2012-0138805 A | | 12/2012 | |
| KR | 10-2013-0033450 A | | 4/2013 | |
| KR | 10-2017-0026956 A | | 3/2017 | |
| KR | 10-2017-0091805 A | | 8/2017 | |
| KR | 10-2018-0009014 A | | 1/2018 | |

* cited by examiner

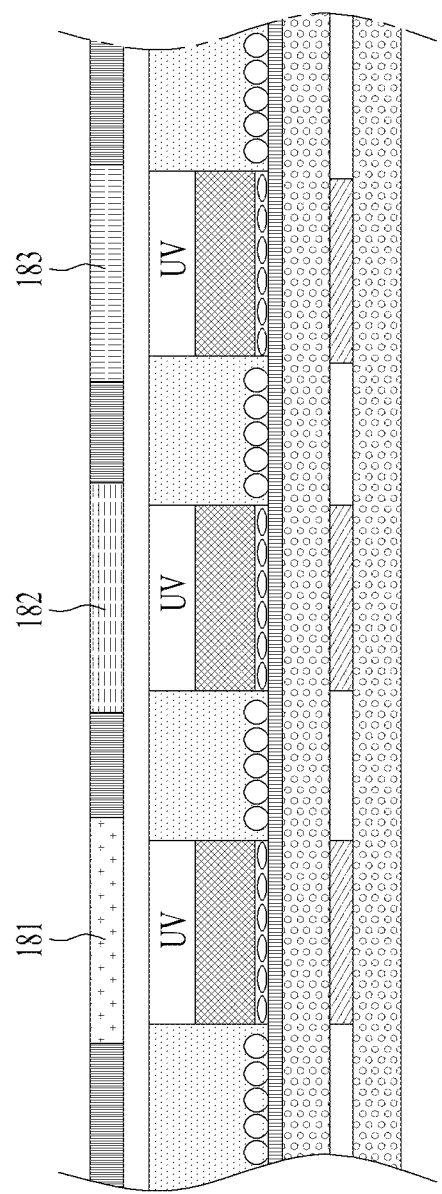

DISPLAY DEVICE USING MICRO-LED, AND MANUFACTURING METHOD THEREFOR

CROSS REFERENCE TO RELATED APPLICATIONS

This application is the National Phase of PCT International Application No. PCT/KR2019/006994, filed on Jun. 11, 2019, which is hereby expressly incorporated by reference into the present application.

TECHNICAL FIELD

The present disclosure is applicable to a display device-related technical field, and relates, for example, to a display device using a micro LED (light emitting diode) and a method for manufacturing the same.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

In a case of the display using the semiconductor light-emitting element, because the semiconductor light-emitting element corresponding to each pixel must be combined with a substrate, implementation of a large-screen high-resolution display may be relatively difficult.

Further, a large amount of semiconductor light-emitting elements are required to realize the large-screen high-resolution display. Therefore, efforts to reduce a manufacturing cost of the individual semiconductor light-emitting elements are required.

SUMMARY

Technical Problem

A purpose of an embodiment of the present disclosure is to provide a display device and a method for manufacturing the same using a vertical semiconductor light-emitting element capable of reducing a manufacturing cost.

A purpose of another embodiment of the present disclosure is to provide a manufacturing method that may be applied to a display device of a large screen and may reduce a defect rate.

Furthermore, a purpose of another embodiment of the present disclosure is to solve various problems not mentioned herein. Those skilled in the art may understand it through the full text of the specification and drawings.

Technical Solutions

A method for manufacturing a display device to achieve the above or other purposes includes forming an assembly electrode on a substrate, applying an insulating layer on the substrate having the assembly electrode formed thereon, defining an assembly groove defined by a partition wall on the substrate having the insulating layer applied thereon, providing an LED having an assembly face corresponding to the assembly groove, and assembling the assembly face of the LED into the assembly groove, the providing of the LED further includes stacking a first electrode, a first semiconductor layer, an active layer, a second semiconductor layer, and a second electrode in a first direction to form a stacked structure, and the assembly face is formed in a second direction corresponding to the first direction of the stacked structure.

In one embodiment of the method, the second direction is horizontal to the first direction of the stacked structure.

In one embodiment of the method, the assembling of the assembly face of the LED into the assembly groove includes contacting the assembly face of the LED to the assembly groove using an assembly device having a magnetic body, and assembling the assembly face of the LED into the assembly groove based on an electric field applied through the assembly electrode formed on the substrate.

In one embodiment of the method, the LED has a longitudinal length X in a first vertical direction to the first direction of the stacked structure, the LED has a transverse length Y in a second vertical direction to the first direction of the stacked structure, and the longitudinal length X has at least two different values, and the transverse length Y has one fixed value.

In one embodiment of the method, the forming of the assembly electrode on the substrate includes forming the assembly electrodes to be spaced apart from each other to respectively overlap portions of the partitioning wall disposed on both side faces of the assembly groove, or forming the single assembly electrode to overlap a bottom face of the assembly groove.

In one embodiment of the method, the first semiconductor layer is an N-type GaN layer, and the second semiconductor layer is a P-type GaN layer.

In one embodiment of the method, the LED includes a magnetic layer.

In one embodiment of the method, the substrate contains at least one of glass, conductor, and flexible polymer materials.

In one embodiment of the method, the defining of the assembly groove includes forming a polymer adhesive layer on at least a portion of a bottom face of the assembly groove with the assembly face of the LED seated thereon.

In one embodiment of the method, the defining of the assembly groove includes forming a metal reflective film on at least a portion of a bottom face of the assembly groove with the active layer of the LED seated thereon.

In one embodiment of the method, the substrate is equipped with a TFT for active matrix driving.

In one embodiment of the method, the LED is an LED (micro-LED) having a micrometer size. In one embodiment of the method, the substrate is equipped with a transistor for active matrix driving.

A display device according to an embodiment of the present disclosure includes at least one LED assembled on a substrate, the substrate includes an assembly electrode layer where an assembly electrode is disposed, an insulating layer applied on top of the assembly electrode, and an assembly groove defined by a partition wall on top of the insulating layer, the LED includes a first electrode, a first semiconductor layer, an active layer, a second semiconductor layer, and a second electrode stacked in a first direction to form a stacked structure, and an assembly face is formed in a second direction corresponding to the first direction of the stacked structure.

Advantageous Effects

According to an embodiment of the present disclosure, because the vertical semiconductor light-emitting element is used in the display device using the semiconductor light-emitting element, there is an effect of reducing the manufacturing cost of the individual semiconductor light-emitting elements.

According to another embodiment of the present disclosure, because the vertical semiconductor light-emitting element has the assembly face corresponding to the assembly groove of the substrate, there is an effect in which the large number of semiconductor light-emitting elements may be easily assembled on the substrate through the self-assembly.

Furthermore, according to another embodiment of the present disclosure, there are additional effects not mentioned herein. Those of ordinary skill in the art may understand it through the full text of the specification and drawings.

DESCRIPTION OF DRAWINGS

FIGS. 5A to 5C are conceptual diagrams illustrating various examples of color implementation with respect to a flip-chip type semiconductor light-emitting element;

DETAILED DESCRIPTION OF THE EMBODIMENTS

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant PDA, a portable multimedia player PMP, a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a In addition, the semiconductor light-emitting element mentioned in this specification is a concept including an LED, a micro LED, and the like.

Figure 1:
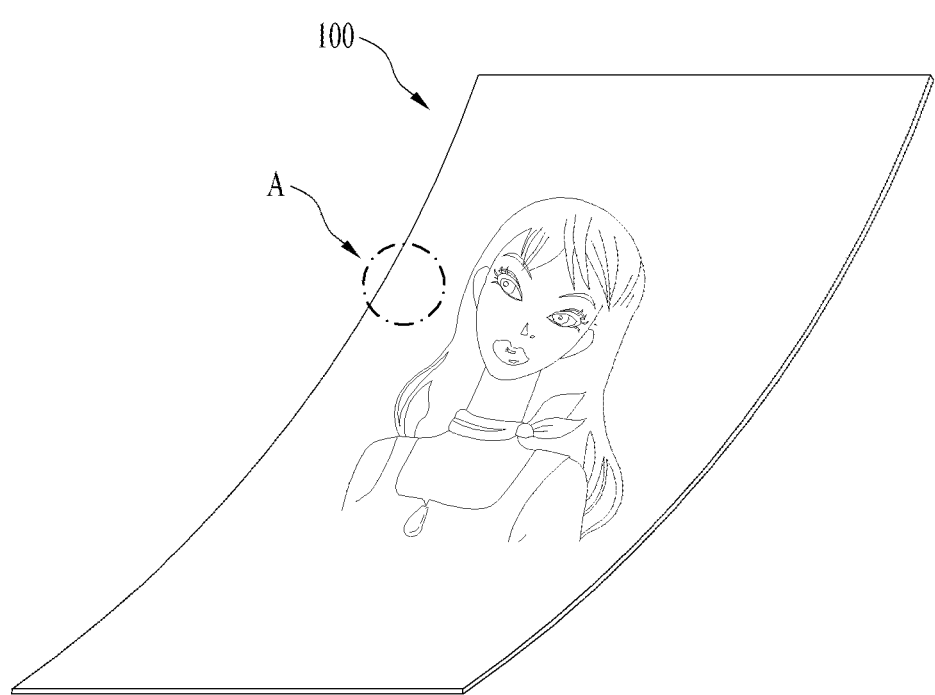
FIG. 1 is a conceptual diagram illustrating an embodiment of a display device using a semiconductor light-emitting element according to the present disclosure.

FIG. 1 is a conceptual view illustrating an embodiment of a display device using a semiconductor light-emitting element according to the present disclosure.

As shown in FIG. 1, information processed by a controller not shown of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state e.g., a state having an infinite radius of curvature hereinafter referred to as a first state, the display area of the flexible display forms a flat surface. When the display in the first state is changed to a bent state e.g., a state having a finite radius of curvature hereinafter referred to as a second state by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light-emitting element. In the present disclosure, a light emitting diode LED is exemplified as a type of the semiconductor light-emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
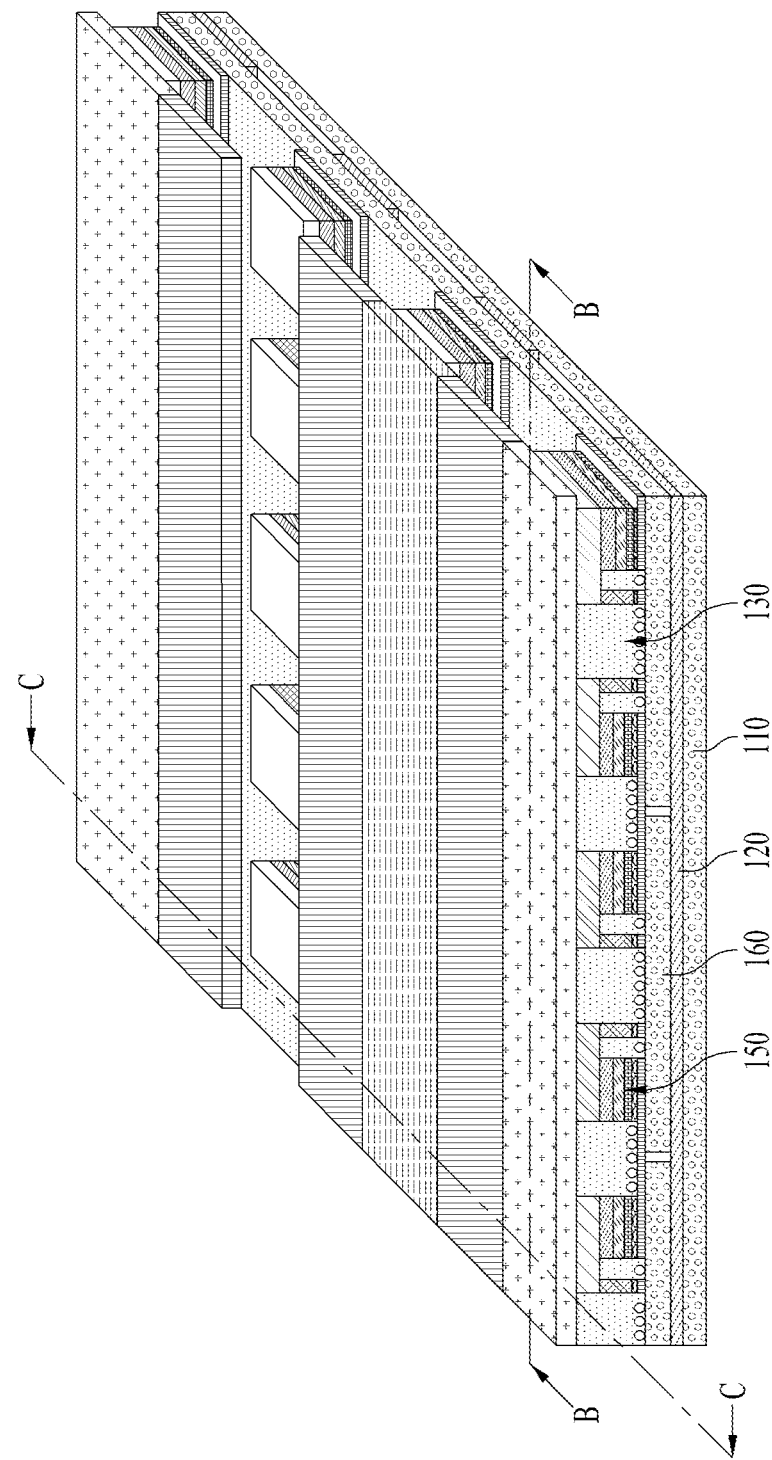
FIG. 2 is a partially enlarged diagram showing a part A shown in FIG. 1.

FIG. 2 is a partially enlarged view showing part A of FIG. 1.

Figure 3A:
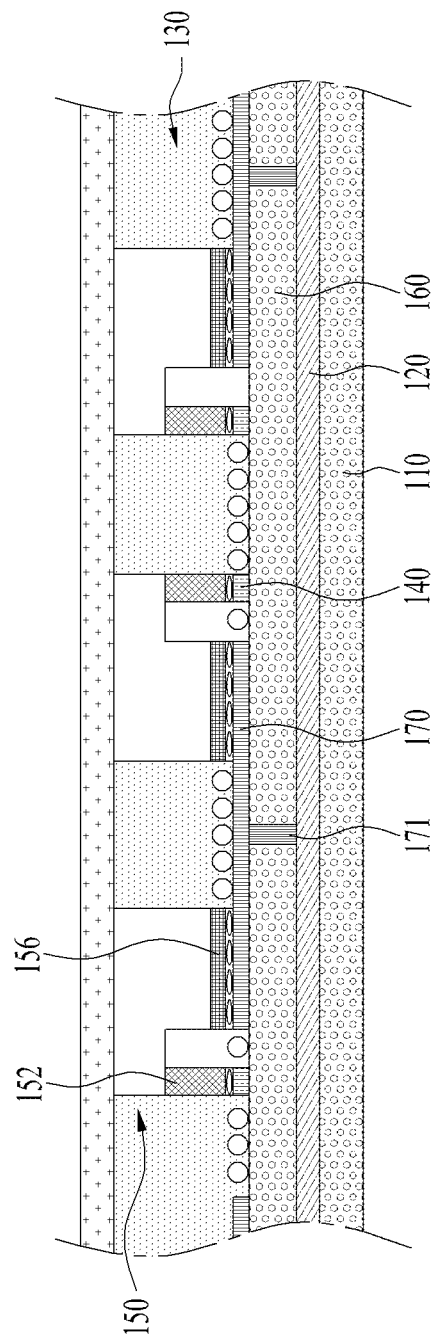
FIGS. 3A and 3B are cross-sectional diagrams taken along the cutting lines B-B and C-C in FIG. 2.
Figure 3B:
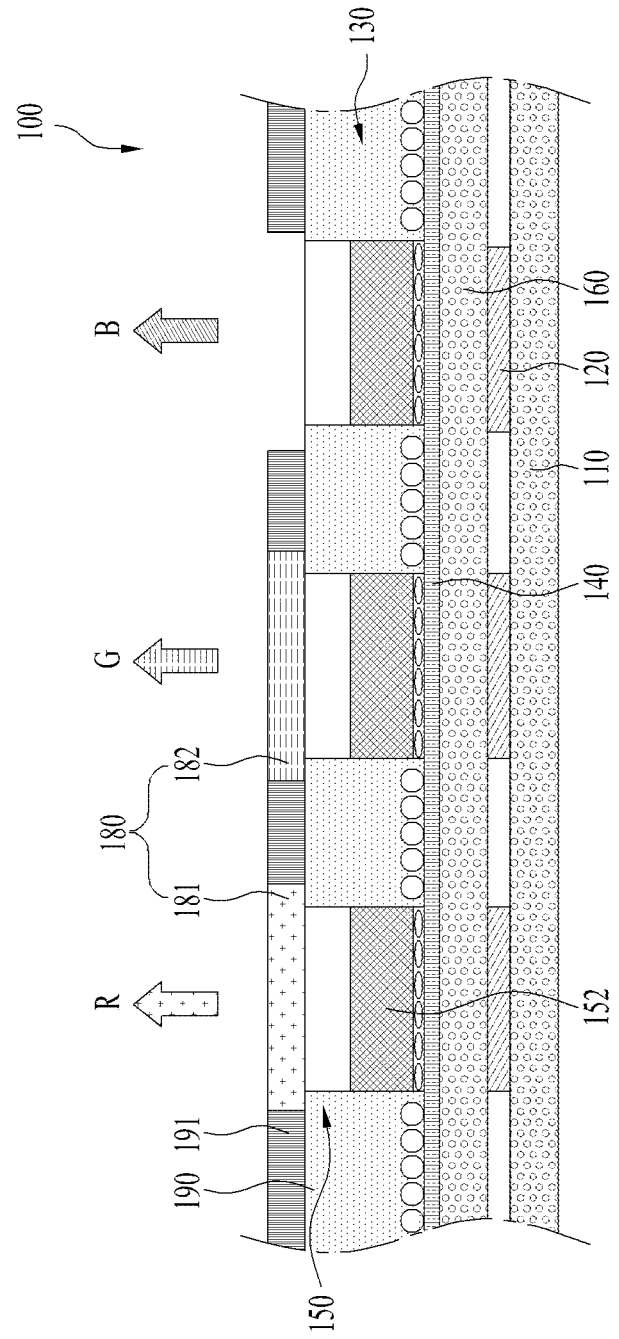

FIGS. 3A and 3B are cross-sectional views taken along lines B-B and C-C in FIG. 2.

Figure 4:
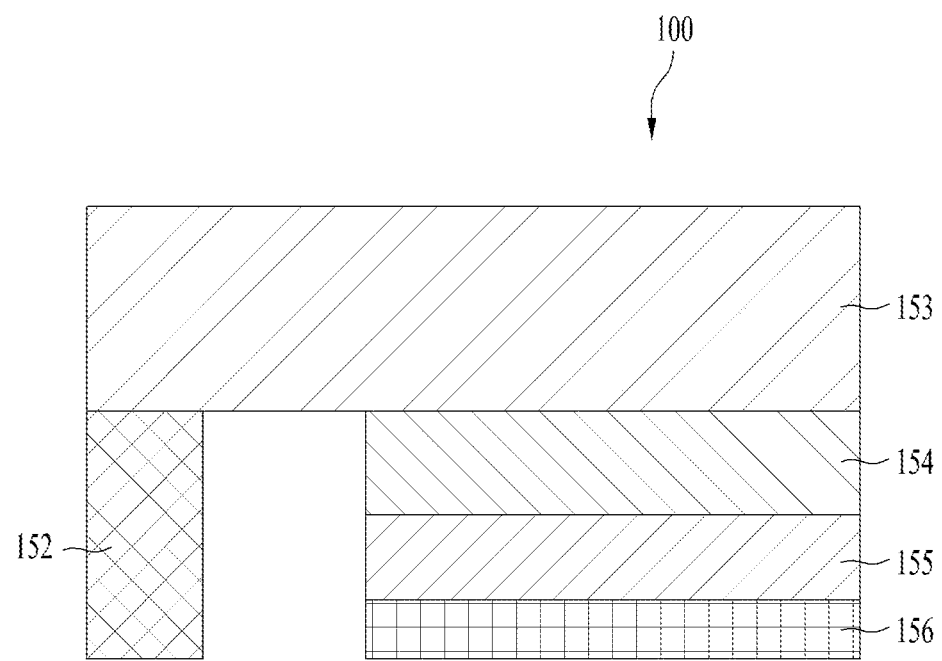
FIG. 4 is a conceptual diagram illustrating the flip-chip type semiconductor light-emitting element of FIG. 3.

FIG. 4 is a conceptual view illustrating the flip-chip type semiconductor light-emitting element of FIG. 3.

Figure 5A:
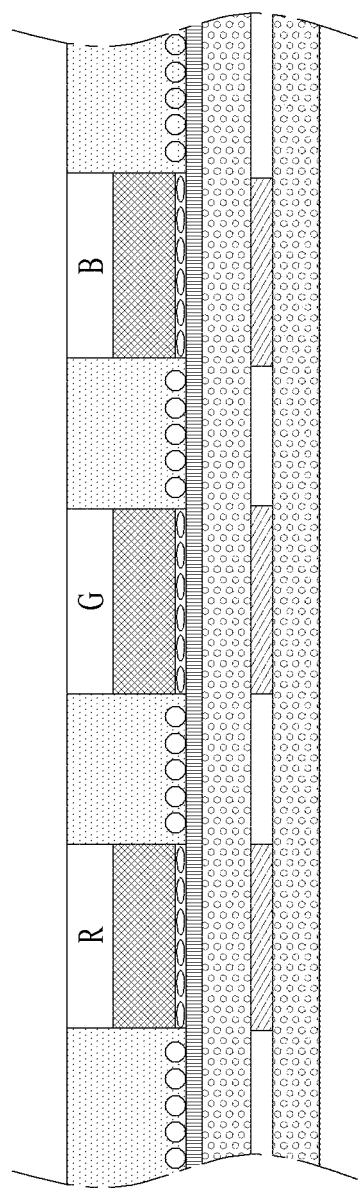
Figure 5B:
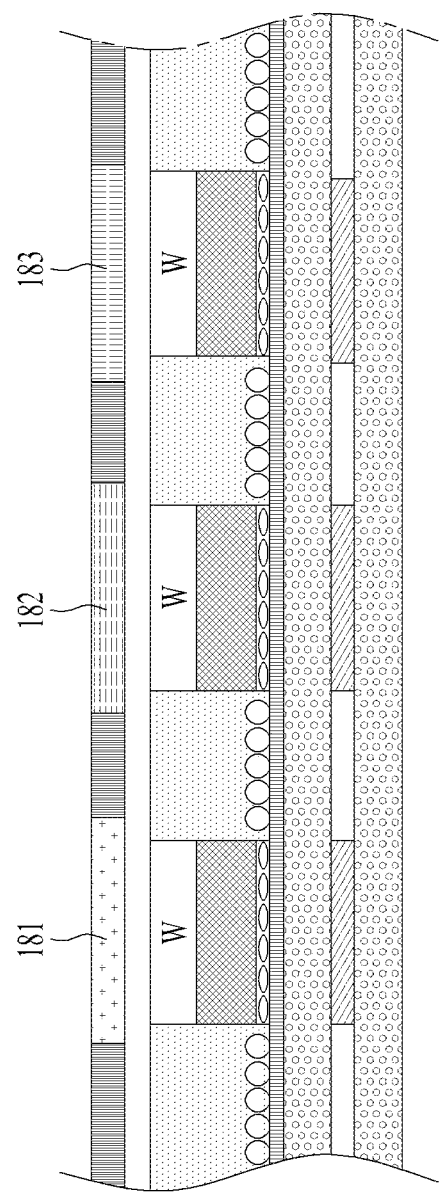

FIGS. 5A to 5C are conceptual views illustrating various examples of implementation of colors in relation to a flip-chip type semiconductor light-emitting element.

As shown in FIGS. 2, 3A and 3B, the display device 100 using a passive matrix PM type semiconductor light-emitting element is exemplified as the display device 100 using a semiconductor light-emitting element. However, the examples described below are also applicable to an active matrix AM type semiconductor light-emitting element.

The display device 100 shown in FIG. 1 may include a substrate 110, a first electrode 120, a conductive adhesive layer 130, a second electrode 140, and at least one semiconductor light-emitting element 150, as shown in FIG. 2.

The substrate 110 may be a flexible substrate. For example, to implement a flexible display device, the substrate 110 may include glass or polyimide PI. Any insulative and flexible material such as polyethylene naphthalate PEN or polyethylene terephthalate PET may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light-emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film ACF, an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer hereinafter, referred to simply as a "conductive adhesive layer".

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed pressed in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers as a double-ACF.

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light-emitting element 150 is connected thereto in a flip-chip form by applying heat and pressure. Thereby, the semiconductor light-emitting element 150 is electrically connected to the first electrode 120 and the second electrode 140.

Referring to FIG. 4, the semiconductor light-emitting element may be a flip chip-type light emitting device.

For example, the semiconductor light-emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light-emitting elements 150. For example, p-type electrodes of semiconductor light-emitting elements on left and right sides of an auxiliary electrode may be electrically connected to one auxiliary electrode.

More specifically, the semiconductor light-emitting element 150 may be press-fitted into the conductive adhesive layer 130 by heat and pressure. Thereby, only the portions of the semiconductor light-emitting element 150 between the p-type electrode 156 and the auxiliary electrode 170 and between the n-type electrode 152 and the second electrode 140 may exhibit conductivity, and the other portions of the semiconductor light-emitting element 150 do not exhibit conductivity as they are not press-fitted. In this way, the conductive adhesive layer 130 interconnects and electrically connects the semiconductor light-emitting element 150 and the auxiliary electrode 170 and interconnects and electrically connects the semiconductor light-emitting element 150 and the second electrode 140.

The plurality of semiconductor light-emitting elements 150 may constitute a light emitting device array, and a phosphor conversion layer 180 may be formed on the light emitting device array.

The light emitting device array may include a plurality of semiconductor light-emitting elements having different luminance values. Each semiconductor light-emitting element 150 may constitute a unit pixel and may be electrically connected to the first electrode 120. For example, a plurality of first electrodes 120 may be provided, and the semiconductor light-emitting elements may be arranged in, for example, several columns. The semiconductor light-emitting elements in each column may be electrically connected to any one of the plurality of first electrodes.

In addition, since the semiconductor light-emitting elements are connected in a flip-chip form, semiconductor light-emitting elements grown on a transparent dielectric substrate may be used. The semiconductor light-emitting elements may be, for example, nitride semiconductor light-emitting elements. Since the semiconductor light-emitting element 150 has excellent luminance, it may constitute an individual unit pixel even when it has a small size.

As shown in FIG. 3, a partition wall 190 may be formed between the semiconductor light-emitting elements 150. In this case, the partition wall 190 may serve to separate individual unit pixels from each other, and may be integrated with the conductive adhesive layer 130. For example, by inserting the semiconductor light-emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator. When a partition wall including a white insulator is used, reflectivity may be increased. When a partition wall including a black insulator is used, it may have reflectance and increase contrast.

The phosphor conversion layer 180 may be positioned on the outer surface of the semiconductor light-emitting element 150. For example, the semiconductor light-emitting element 150 may be a blue semiconductor light-emitting element that emits blue B light, and the phosphor conversion layer 180 may function to convert the blue B light into a color of a unit pixel. The phosphor conversion layer 180 may be a red phosphor 181 or a green phosphor 182 constituting an individual pixel.

That is, the red phosphor 181 capable of converting blue light into red R light may be laminated on a blue semiconductor light-emitting element at a position of a unit pixel of red color, and the green phosphor 182 capable of converting blue light into green G light may be laminated on the blue semiconductor light-emitting element at a position of a unit pixel of green color. Only the blue semiconductor light-emitting element may be used alone in the portion constituting the unit pixel of blue color. In this case, unit pixels of red R, green G, and blue B may constitute one pixel. More specifically, a phosphor of one color may be laminated along each line of the first electrode 120. Accordingly, one line on the first electrode 120 may be an electrode for controlling one color. That is, red R, green G, and blue B may be sequentially disposed along the second electrode 140, thereby implementing a unit pixel.

However, embodiments of the present disclosure are not limited thereto. Unit pixels of red R, green G, and blue B may be implemented by combining the semiconductor light-emitting element 150 and the quantum dot QD rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light-emitting element may be implemented as a high-power light emitting device emitting light of various colors including blue by using gallium nitride GaN as a main material and adding indium In and/or aluminum Al.

In this case, each semiconductor light-emitting element may be a red, green, or blue semiconductor light-emitting element to form a unit pixel sub-pixel. For example, red, green, and blue semiconductor light-emitting elements R, G, and B may be alternately disposed, and unit pixels of red, green, and blue may constitute one pixel by the red, green and blue semiconductor light-emitting elements. Thereby, a full-color display may be implemented.

Referring to FIG. 5B, the semiconductor light-emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet UV light may be used in the entire region of the semiconductor light-emitting element. In an embodiment, UV may be used as an excitation source of the upper phosphor in the semiconductor light-emitting element.

Referring back to this example, the semiconductor light-emitting element is positioned on the conductive adhesive layer to constitute a unit pixel. Since the semiconductor light-emitting element has excellent luminance, individual unit pixels may be configured despite even when the semiconductor light-emitting element has a small size.

Regarding the size of such an individual semiconductor light-emitting element, the length of each side of the device may be, for example, 80 µm or less, and the device may have a rectangular or square shape. When the semiconductor light-emitting element has rectangular shape, the size thereof may be less than or equal to 20 µm×80 µm.

In addition, even when a square semiconductor light-emitting element having a side length of 10 µm is used as a unit pixel, sufficient brightness to form a display device may be obtained.

Therefore, for example, in case of a rectangular pixel having a unit pixel size of 600 µm×300 µm i.e., one side by the other side, a distance of a semiconductor light-emitting element becomes sufficiently long relatively.

Thus, in this case, it is able to implement a flexible display device having high image quality over HD image quality.

The above-described display device using the semiconductor light-emitting element may be prepared by a new fabricating method. Such a fabricating method will be described with reference to FIG. 6 as follows.

Figure 6:
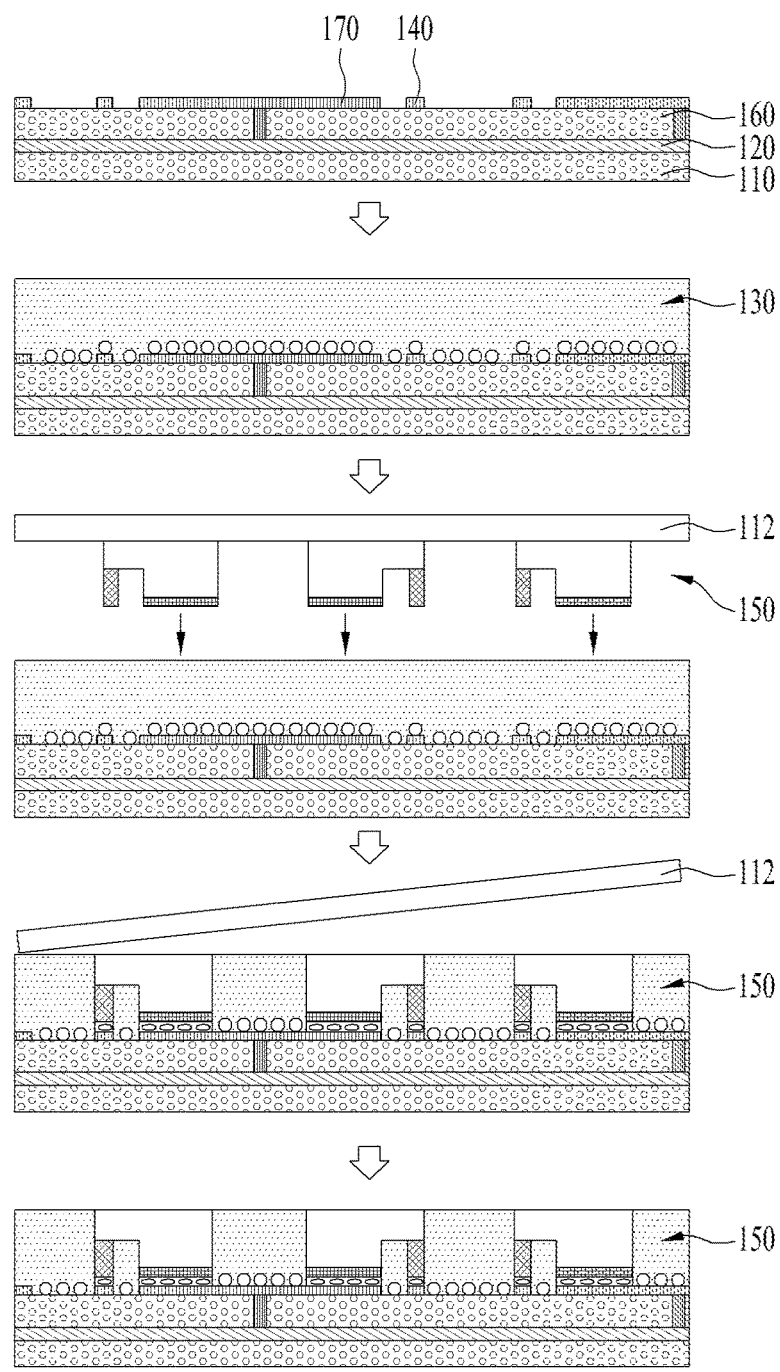
FIG. 6 shows cross-sectional views of a method of fabricating a display device using a semiconductor light-emitting element according to the present disclosure.

FIG. 6 shows cross-sectional views of a method of fabricating a display device using a semiconductor light-emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide PI each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light-emitting elements 150 configuring individual pixels are located to correspond to locations of the auxiliary electrode 170 and the second electrodes 140, is disposed in a manner that the semiconductor light-emitting element 150 confronts the auxiliary electrode 170 and the second electrode 140.

In this regard, the temporary 112 substrate 112 is a growing substrate for growing the semiconductor light-emitting element 150 and may include a sapphire or silicon substrate.

The semiconductor light-emitting element is configured to have a space and size for configuring a display device when formed in unit of wafer, thereby being effectively used for the Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light-emitting element 150, the auxiliary electrode 170 and the second electrode 140 has conductivity, via which the electrodes and the semiconductor light-emitting element 150 may be connected electrically. In this case, the semiconductor light-emitting element 150 is inserted into the anisotropic conductive film, by which a partition may be formed between the semiconductor light-emitting elements 150.

Then the temporary substrate 112 is removed. For example, the temporary substrate 112 may be removed using Laser Lift-Off LLO or Chemical Lift-Off CLO.

Finally, by removing the temporary substrate 112, the semiconductor light-emitting elements 150 exposed externally. If necessary, the wiring substrate 110 to which the semiconductor light-emitting elements 150 are coupled may be coated with silicon oxide SiOx or the like to form a transparent insulating layer not shown.

In addition, a step of forming a phosphor layer on one side of the semiconductor light-emitting element 150 may be further included. For example, the semiconductor light-emitting element 150 may include a blue semiconductor light-emitting element emitting Blue B light, and a red or green phosphor for converting the blue B light into a color of a unit pixel may form a layer on one side of the blue semiconductor light-emitting element.

The above-described fabricating method or structure of the display device using the semiconductor light-emitting element may be modified into various forms. For example, the above-described display device may employ a vertical semiconductor light-emitting element.

Furthermore, a modification or embodiment described in the following may use the same or similar reference numbers for the same or similar configurations of the former example and the former description may apply thereto.

Figure 7:
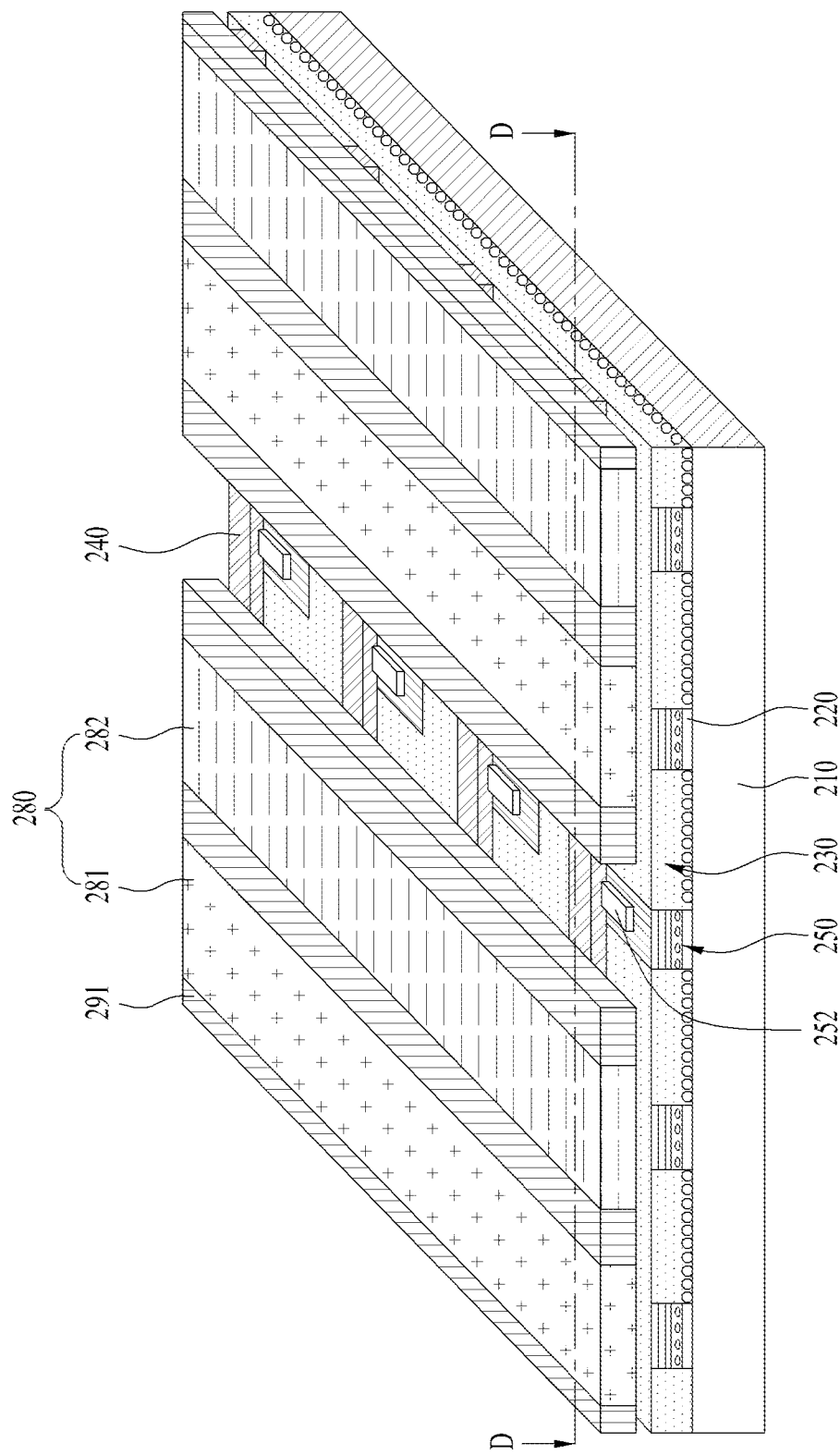
FIG. 7 is a perspective diagram of a display device using a semiconductor light-emitting element according to another embodiment of the present disclosure.
Figure 8:
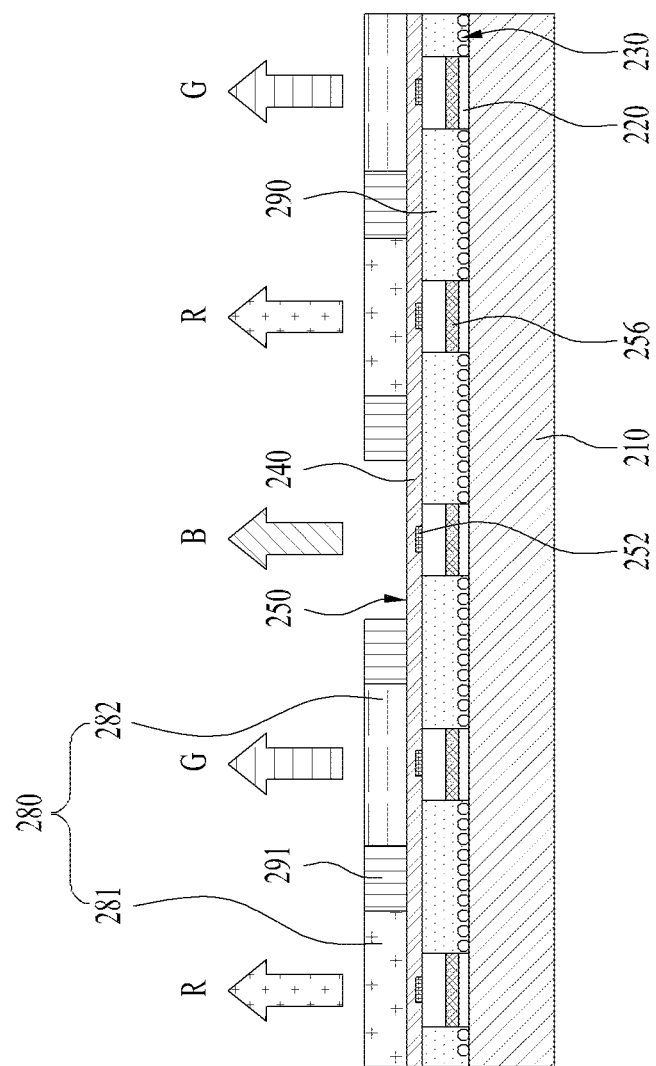
FIG. 8 is a cross-sectional diagram taken along a cutting line D-D shown in FIG. 8.
Figure 9:
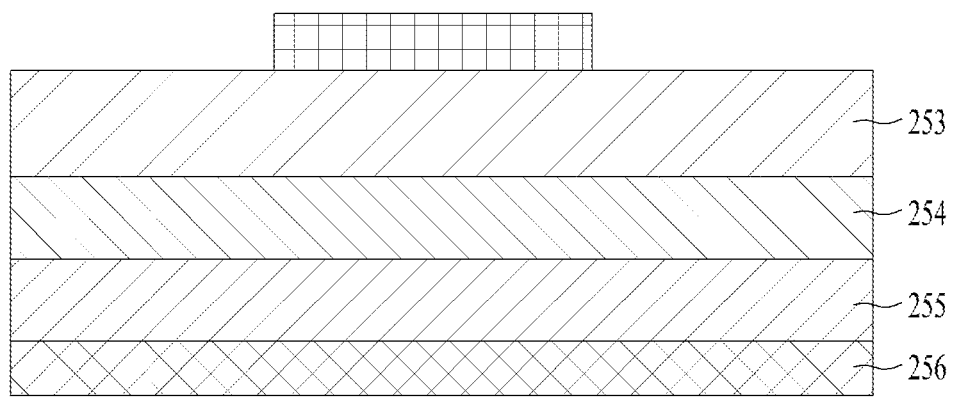
FIG. 9 is a conceptual diagram showing a vertical semiconductor light-emitting element shown in FIG. 8.

FIG. 7 is a perspective diagram of a display device using a semiconductor light-emitting element according to another embodiment of the present disclosure, FIG. 8 is a cross-sectional diagram taken along a cutting line D-D shown in FIG. 8, and FIG. 9 is a conceptual diagram showing a vertical semiconductor light-emitting element shown in FIG. 8.

Referring to the present drawings, a display device may employ a vertical semiconductor light emitting device of a Passive Matrix PM type.

The display device includes a substrate 210, a first electrode 220, a conductive adhesive layer 230, a second electrode 240 and at least one semiconductor light-emitting element 250.

The substrate 210 is a wiring substrate on which the first electrode 220 is disposed and may contain polyimide PI to implement a flexible substrate. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film ACF, an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light-emitting element 250 is connected by applying heat and pressure thereto, the semiconductor light-emitting element 250 is electrically connected to the first electrode 220. In doing so, the semiconductor light-emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light-emitting element 250 and the first electrode 220 as well as mechanical connection.

Thus, the semiconductor light-emitting element 250 is located on the conductive adhesive layer 230, via which an individual pixel is configured. As the semiconductor light-emitting element 250 has excellent luminance, an individual unit pixel may be configured in small size as well. Regarding a size of the individual semiconductor light-emitting element 250, a length of one side may be equal to or smaller than 80 μm example and the individual semiconductor light-emitting element 250 may include a rectangular or square element. For example, the rectangular element may have a size equal to or smaller than 20 μm×80 μm.

The semiconductor light-emitting element 250 may have a vertical structure.

Among the vertical semiconductor light-emitting elements, a plurality of second electrodes 240 respectively and electrically connected to the vertical semiconductor light-emitting elements 250 are located in a manner of being disposed in a direction crossing with a length direction of the first electrode 220.

Referring to FIG. 9, the vertical semiconductor light-emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical semiconductor light-emitting element 250 can dispose the electrodes at top and bottom, it is considerably advantageous in reducing a chip size.

Referring to FIG. 8 again, a phosphor layer 280 may formed on one side of the semiconductor light-emitting element 250. For example, the semiconductor light-emitting element 250 may include a blue semiconductor light-emitting element 251 emitting blue B light, and a phosphor layer 280 for converting the blue B light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red R light may be stacked on a blue semiconductor light-emitting element. At a location of configuring a green unit pixel, the green phosphor 282 capable of converting blue light into green G light may be stacked on the blue semiconductor light-emitting element. Moreover, the blue semiconductor light-emitting element may be singly usable for a portion that configures a blue unit pixel. In this case, the unit pixels of red R, green G and blue B may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light-emitting elements 250 and connected to the semiconductor light-emitting elements electrically. For example, the semiconductor light-emitting elements 250 are disposed in a plurality of columns, and the second electrode 240 may be located between the columns of the semiconductor light-emitting elements 250.

Since a distance between the semiconductor light-emitting elements 250 configuring the individual pixel is sufficiently long, the second electrode 240 may be located between the semiconductor light-emitting elements 250.

The second electrode 240 may be formed as an electrode of a bar type that is long in one direction and disposed in a direction vertical to the first electrode.

In addition, the second electrode 240 and the semiconductor light-emitting element 250 may be electrically connected to each other by a connecting electrode protruding from the second electrode 240. Particularly, the connecting electrode may include a n-type electrode of the semiconductor light-emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light-emitting element 250 may be electrically connected to each other.

Referring to FIG. 8 again, the second electrode 240 may be located on the conductive adhesive layer 230. In some cases, a transparent insulating layer not shown containing silicon oxide SiOx and the like may be formed on the substrate 210 having the semiconductor light-emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide ITO or the like is sued to place the second electrode 240 on the semiconductor light-emitting element 250, there is a problem that ITO substance has poor adhesiveness to an n-type semiconductor layer. Therefore, according to the present disclosure, as the second electrode 240 is placed between the semiconductor light-emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light-emitting elements 250. Namely, in order to isolate the semiconductor light-emitting element 250 configuring the individual pixel, the partition 290 may be disposed between the vertical semiconductor light-emitting elements 250. In this case, the partition 290 may play a role in separating the individual unit pixels from each other and be formed with the conductive adhesive layer 230 as an integral part. For example, by inserting the semiconductor light-emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator.

In case that the second electrode 240 is located right onto the conductive adhesive layer 230 between the semiconductor light-emitting elements 250, the partition 290 may be located between the vertical semiconductor light-emitting element 250 and the second electrode 240 each. Therefore, an individual unit pixel may be configured using the semiconductor light-emitting element 250. Since a distance between the semiconductor light-emitting elements 250 is sufficiently long, the second electrode 240 can be placed between the semiconductor light-emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

In the display device using the semiconductor light-emitting element of the present disclosure described above, the semiconductor light-emitting element grown on a wafer is placed on a wiring substrate in the flip-chip form and used as an individual pixel.

Therefore, there is a problem in that it is difficult to implement a large screen display because of a size limitation of the wafer. Another embodiment of the present disclosure for solving such a problem will be described later in detail in FIGS. 10 to 19 below. Further, although, for example, the display device to which the vertical semiconductor light-emitting element self-assembled in a fluid is applied will be mainly described, the scope of the present disclosure is not necessarily limited thereto.

Figure 10:
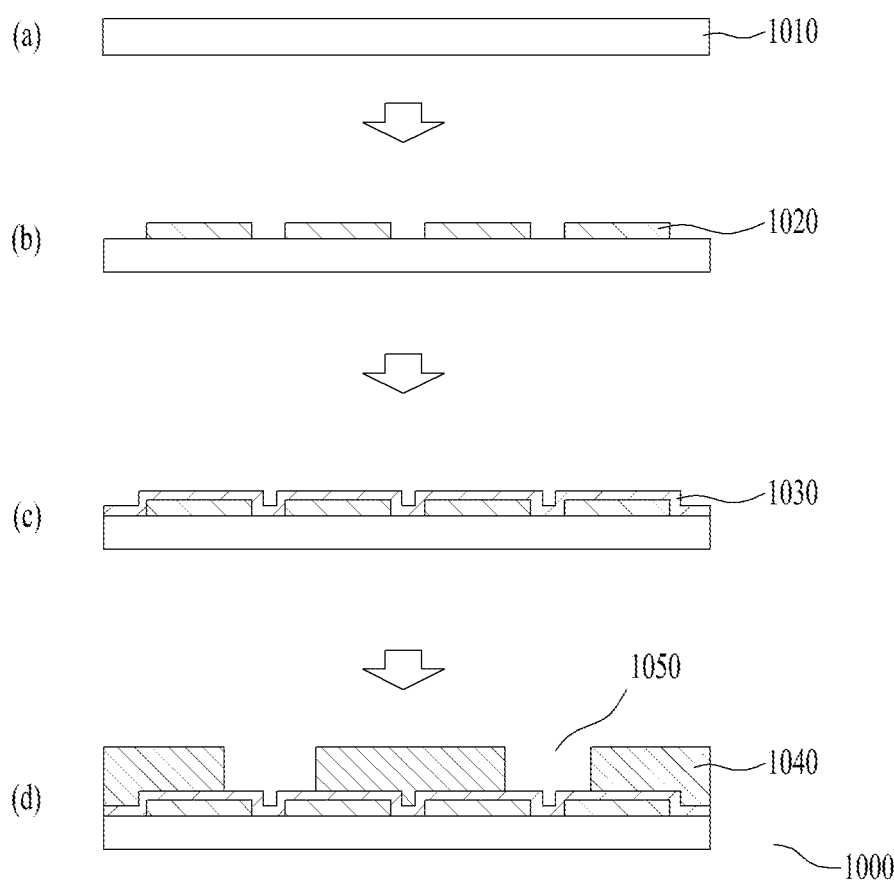
FIG. 10 shows diagrams showing a process of manufacturing a substrate having an assembly groove defined thereon for assembling a semiconductor light-emitting element according to another embodiment of the present disclosure.

FIG. 10 is a process diagram of manufacturing a substrate 1000 having an assembly groove defined thereon for assembling the semiconductor light-emitting element according to another embodiment of the present disclosure.

As shown in FIG. 10, the substrate 1000 has the assembly groove defined thereon that allows the semiconductor light-emitting element to be self-assembled onto the prepared substrate in the fluid.

A self-assembly scheme refers to, for example, a process in which a plurality of semiconductor light-emitting elements grown on the wafer are separated into individual elements, dispersed in the fluid, and then assembled onto the substrate using an electromagnetic field.

The semiconductor light-emitting element may be manufactured as a horizontal semiconductor light-emitting element or a vertical semiconductor light-emitting element.

Although the horizontal semiconductor light-emitting element has an advantage of being relatively easy to be manufactured, it is difficult to reduce a size of the individual elements manufactured on the wafer because an n-electrode and a p-electrode must be formed on the same plane.

In a case of the vertical semiconductor light-emitting element, there is an advantage that the size of the element manufactured on the wafer may be reduced. However, because the n-electrode and the p-electrode must be disposed on upper/lower faces rather than on the same plane, a wiring process after the assembly is more complicated than that of the horizontal element, and a defect rate is relatively high because of the complicated wiring process.

Therefore, it is essential to reduce the manufacturing cost for the large screen high resolution display device. Thus, there is a need for a display device and a method for manufacturing the same that may solve the above-mentioned complicated process problem while using the vertical semiconductor light-emitting element.

As shown in FIG. 10, an assembly groove 1050 has a shape corresponding to a side portion of the vertical semiconductor light-emitting element such that the vertical semiconductor light-emitting element is disposed on the substrate in a horizontal direction.

First, the manufacturing method will be described. A substrate 1010 is selected, an assembly electrode 1020 is disposed on the substrate 1010, and an insulating layer 1030 and a partition wall 1040 are formed on top of the assembly electrode 1020.

The substrate 1010 may be a flexible substrate. For example, in order to implement a flexible display device, the substrate 1010 may contain, for example, glass or polyimide (PI). In addition, when it is an insulating and flexible material, for example, any of PEN (polyethylene naphthalate), PET (polyethylene terephthalate), and the like may be used. Further, the substrate 1010 may be made of either a transparent material or an opaque material.

The assembly electrode 1020 formed on top of the substrate 1010 is disposed for the purpose of inducing a dielectrophoresis (DEP) phenomenon by the electric field during the self-assembly.

The assembly electrode 1020 may be implemented as, for example, a transparent electrode (ITO), or a single layer of molybdenum or a multi-layer structure of molybdenum and aluminum, and may be implemented using other common materials.

The assembly electrodes 1020 may correspond to a pair of assembly electrodes for fixing the assembled vertical semiconductor light-emitting element by forming the electric field as a voltage is applied thereto. A spacing between the assembly electrodes 1020 may be smaller than a width of the vertical semiconductor light-emitting element and a width of the assembly groove 1050, so that the assembly position of the vertical semiconductor light-emitting element using the electric field may be more precisely fixed.

The insulating layer 1030 may be formed on the assembly electrode 1020 to protect the assembly electrode 1020 from the fluid and prevent leakage of current flowing through the assembly electrode 1020. For example, the insulating layer 1030 may be formed of a single layer or multiple layers of an inorganic insulator such as silica or alumina or an organic insulator. The insulating layer 1030 may have a minimum thickness for preventing damage to the assembly electrode 1020 when assembling the vertical semiconductor light-emitting element, and may have a maximum thickness for stably assembling the vertical semiconductor light-emitting element.

The partition wall 1040 may be formed on top of the insulating layer 1030. A partial area of the partition wall 1040 may be located on top of the assembly electrode 1020, and the remaining area may be located on top of the substrate 1010.

For example, during the manufacturing of the substrate 1010, as a portion of the partition wall 1040 formed on top of the entire insulating layer 1030 is removed, the assembly groove 1050 through which each of the vertical semiconductor light-emitting elements is coupled and assembled to the substrate 1010 may be defined.

The assembly groove 1050 may be defined using a photolithography method by coating a photosensitive material. Alternatively, the substrate for the substrate is first coated with glass, SOG (spin on glass), and a polymer material, and then coated with the photosensitive material to form a pattern using the photolithography method. Then, dry etching or wet etching is performed and the photosensitive material is removed.

Figure 11:
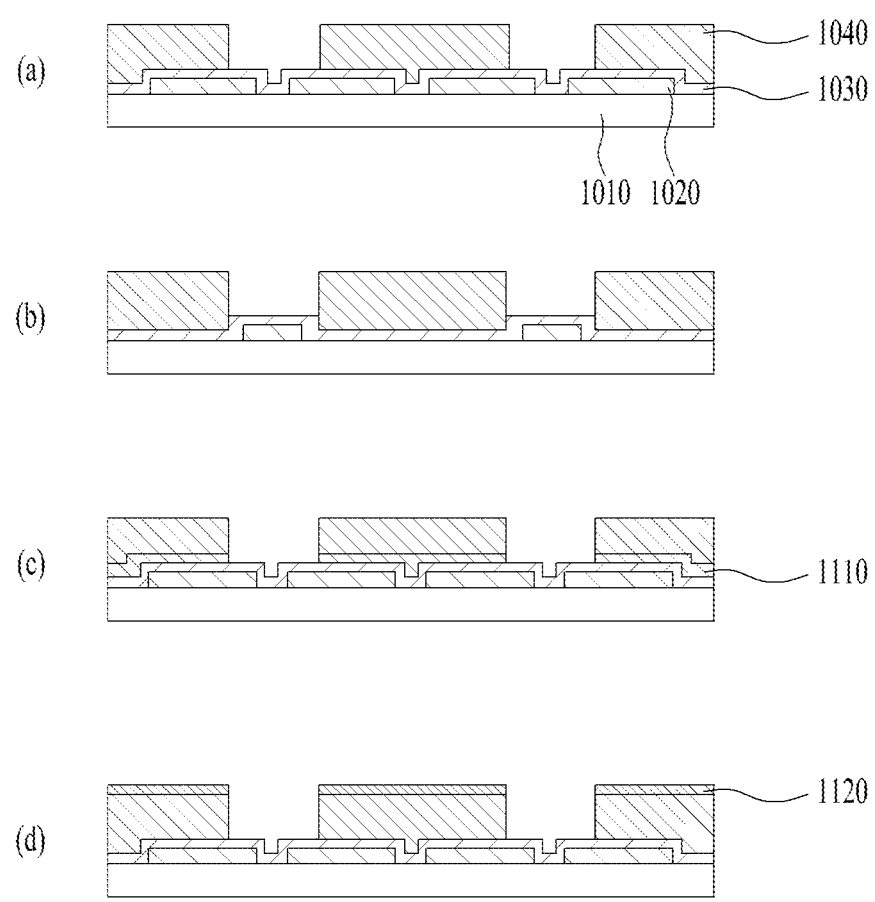
FIG. 11 is a diagram of an arrangement method of assembly electrodes included in a substrate in FIG. 10 and an additionally formed metal layer.

FIG. 11 is a diagram of an arrangement method of the assembly electrodes 1020 included on the substrate in FIG. 10 and additionally formed metal layers 1110 and 1120.

A pair of assembly electrodes 1020 should be disposed to generate the electric field, but a position at which each assembly electrode is disposed may vary.

(a) in FIG. 11 is a structure in which the pair of assembly electrodes 1020 are disposed below both side faces of one assembly groove, respectively. The electric field is generated by a difference in the voltage between the assembly electrodes. The applied voltage means an AC voltage, induced dipole is generated in a dielectric by the AC voltage, and the element is able to be fixed to the substrate by a DEP force.

(b) in FIG. 11 is a structure in which one assembly electrode is disposed below one assembly groove. It is a structure in which the difference in the voltage occurs in a relationship with an assembly electrode disposed below another assembly groove, and the number of assembly electrodes is able to be reduced compared to (a) in FIG. 11.

(c) in FIG. 11 shows a structure including the metal layer 1110 on the partition wall 1040. The metal layer 1110 serves to shield the electric field generated by the assembly electrodes, and helps the electric field generated by the assembly electrodes to be formed only in the assembly groove.

The metal layer may be formed between the insulating layer and the partition wall, and may be formed on top of the partition wall.

(d) in FIG. 11 shows a structure in which the metal layer 1120 is formed only on top of the partition wall.

The metal layer may be, for example, a thin metal film such as aluminum (Al) or copper (Cu).

Figure 12:
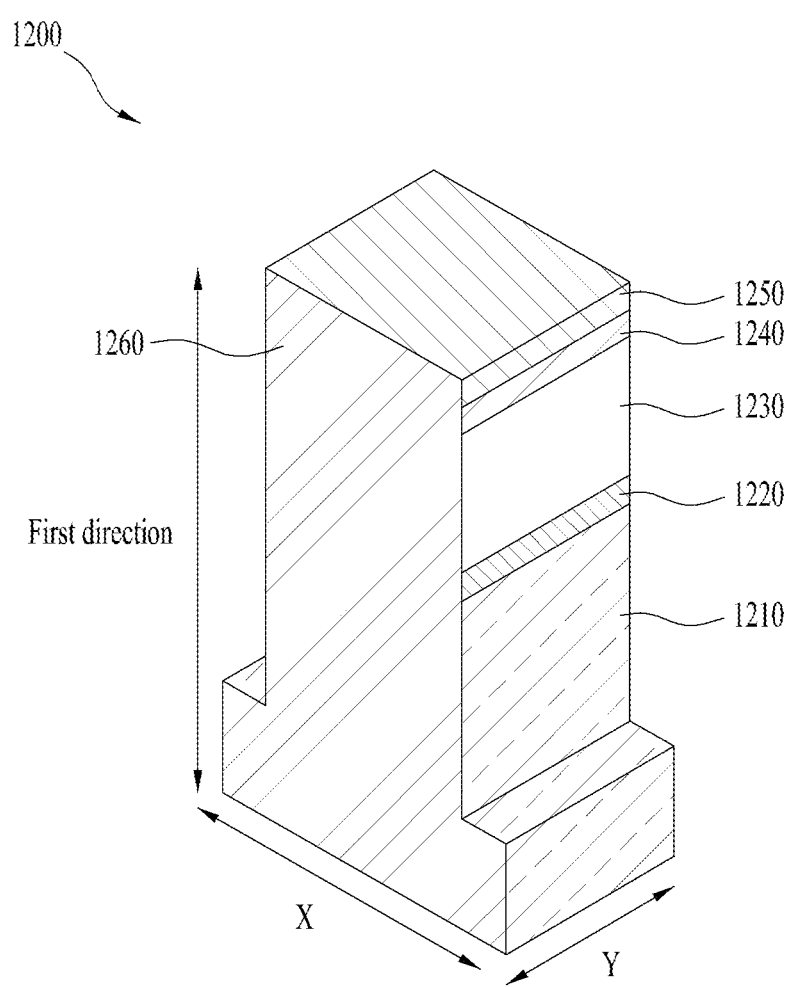
FIG. 12 is a diagram schematically showing a structure of a vertical semiconductor light-emitting element assembled on a substrate in FIG. 10.

FIG. 12 is a diagram schematically showing a structure of a vertical semiconductor light-emitting element 1200 assembled on the substrate in FIG. 10.

As shown in FIG. 12, the vertical semiconductor light-emitting element 1200 may include a first semiconductor layer 1210, an active layer 1220 formed on the first semiconductor layer 1210, a second semiconductor layer 1230 formed on the active layer 1220, a magnetic layer 1240 formed on the second semiconductor layer 1230, and a second electrode 1250 formed on the magnetic layer 1240.

A stack structure of the vertical semiconductor light-emitting element 1200 is a structure that may be naturally formed while growing the vertical semiconductor light-emitting element 1200 on the wafer, and a first electrode connected to the first semiconductor layer may be formed through a separate process.

Furthermore, the stack structure of the vertical semiconductor light-emitting element 1200 in FIG. 12 is only for easy understanding of the embodiment disclosed in the present disclosure, and it should be noted that the present disclosure should not be construed as being limited only to the components shown in the accompanying drawings.

In order to further describe structural characteristics of the vertical semiconductor light-emitting element 1200, a stacked direction will be referred to as a first direction.

The vertical semiconductor light-emitting element 1200 has a longitudinal length X as a first vertical direction to the first direction, and a transverse length Y as a second vertical direction to the first direction. The longitudinal length X may correspond to one of a maximum value X1, a minimum value X2, and a value between the maximum value X1 and the minimum value X2, whereas the transverse length Y may have a fixed value.

As the transverse length Y has the fixed value, for example, the vertical semiconductor light-emitting element forms a flat assembly face 1260 in a direction horizontal to the first direction. The assembly face 1260 has a shape corresponding to a lower portion of the assembly groove 1050 defined in the substrate in FIG. 10, so that the assembly face 1260 may be seated on the lower portion of the assembly groove 1050 during the self-assembly.

That is, a side portion of the vertical semiconductor light-emitting element 1200 becomes the assembly face 1260 and is assembled with the substrate in the horizontal direction.

The reason the longitudinal length X corresponds to one of the maximum value X1, the minimum value X2, and the value between the maximum value X1 and the minimum value X2 is to distinguish the semiconductor layer 1210 and the second semiconductor layer 1230 that are assembled when the vertical semiconductor light-emitting element 1200 is assembled into the assembly groove 1050.

For example, when a longitudinal length of the first semiconductor layer 1210 is greater than a longitudinal length of the second semiconductor layer 1230, the vertical semiconductor light-emitting element may have a T-shape structure, and the first semiconductor layer 1210 and the second semiconductor layer 1230 may be easily distinguished. Accordingly, even when being self-assembled on the substrate, the vertical semiconductor light-emitting element may be assembled with a certain directionality.

However, when the longitudinal length X does not change and has only a fixed value, it is difficult to distinguish the first semiconductor layer 1210 and the second semiconductor layer 1230 based on the assembly face 1260 of the vertical semiconductor light-emitting element 1200.

Therefore, the vertical semiconductor light-emitting element 1200 will be randomly assembled in the assembly groove 1250. In the display device in which the plurality of semiconductor light-emitting elements are arranged in the matrix form, it is impossible to apply a voltage based on a type of the semiconductor layer.

Accordingly, the vertical semiconductor light-emitting element 1200 has at least two longitudinal length values X1 and X2 and one fixed transverse length Y, and thus, has two assembly faces that may be assembled in the first direction.

Another purpose of changing the longitudinal length X is to change the shape based on the type of the semiconductor light-emitting element. In order to implement the display device, red R, green G, and blue B light-emitting elements are required, and they must be precisely assembled at positions thereof based on the types thereof. When the elements may have the different shapes and the assembly grooves respectively corresponding thereto may be defined in the substrate, the accurate assembly based on the element type is possible in the subsequent self-assembly process.

Further, another feature of one embodiment of the present invention is that a difference between the maximum value X1 and the minimum value X2 of the longitudinal length X is determined in consideration of the dielectrophoresis (DEP) phenomenon caused by the electric field.

The dielectrophoresis is a method of moving dielectric particles using a force generated by the dielectric particles having the induced-dipole in a non-uniform electric field.

As described above, the vertical semiconductor light-emitting element 1200 may have the two assembly faces 1260. On the remaining faces except for the assembly face 1260, a gap is defined with the lower portion of the assembly groove 1050 based on the difference between the maximum value X1 and the minimum value X2. When the gap is greater than an effective distance at which the force by the dielectrophoresis phenomenon (DEP force) acts, the vertical semiconductor light-emitting element 1200 may not be able to be assembled into the assembly groove with the remaining faces.

The effective distance at which the DEP force acts is, for example, within 200 nm. Therefore, as a result of experimentally manufacturing the vertical semiconductor light-emitting element 1200 with the difference between the maximum value X1 and the minimum value X2 within a range between 200 nm and 20 µm, the vertical semiconductor light-emitting element 1200 is assembled only with the assembly face 1260. The difference is assumed in a structure in which a portion of the vertical semiconductor light-emitting element protrudes in only one direction. It was experimentally identified that, when the vertical semiconductor light-emitting element has a T-shaped structure symmetrical with respect to the stacked direction, the difference is preferably within a range of 400 nm to 20 µm.

In a display device in which a position of the unit pixel must be precisely controlled, it is very important to allow the vertical semiconductor light-emitting element 1200 to be assembled only with the assembly face, because when the vertical semiconductor light-emitting element 1200 is assembled with the remaining faces other than the assembly face 1260, a defect may immediately occur. Therefore, there is an effect of significantly lowering the defect rate when designing as above.

Again, in the vertical semiconductor light-emitting element in FIG. 12, the first semiconductor layer 1210 and the second semiconductor layer 1230 are different types of semiconductor layers, and may be an n-type or p-type semiconductor layer.

For example, when the first semiconductor layer 1210 is the n-type semiconductor layer, the second semiconductor layer is the p-type semiconductor layer.

Each of the n-type semiconductor layer and the p-type semiconductor layer has gallium nitride (GaN) or gallium arsenide (GaAs) as a main material, and has materials such as indium (In), aluminum (Al), and the like added thereto to emit light of various colors.

The magnetic layer 1240 may contain, for example, a metal having a magnetism such as nickel (Ni). It is shown in FIG. 12 that the magnetic layer 1240 is disposed on top of the second semiconductor layer 1230, but a position of the magnetic layer 1240 may be changed depending on the method for manufacturing the vertical semiconductor light-emitting element 1200.

By having the magnetic layer 1240, the vertical semiconductor light-emitting element 1200 may move in a direction of the substrate in the fluid by a magnetic field during the self-assembly.

In one example, the vertical semiconductor light-emitting element 1200 may further include a first electrode and a passivation layer.

The first electrode may be connected to the first semiconductor layer 1210. To this end, the vertical semiconductor light-emitting element 1200 grown on the wafer must be separated from the wafer, and a separate electrode forming process must be performed.

The passivation layer may be formed to surround a top face and a side face of the vertical semiconductor light-emitting element 1200. Because the passivation layer is formed in the state in which the vertical semiconductor light-emitting element 1200 is connected to the wafer, the passivation layer may not be formed on a bottom face of the vertical semiconductor light-emitting element 1200.

The passivation layer may be formed through PECVD (plasma enhanced chemical vapor deposition), LPCVD (low pressure CVD), sputtering deposition, and the like of the inorganic insulator such as the silica, the alumina, and the like, or through photoresist or spin-coating of an organic material such as a polymer material.

Figure 13:
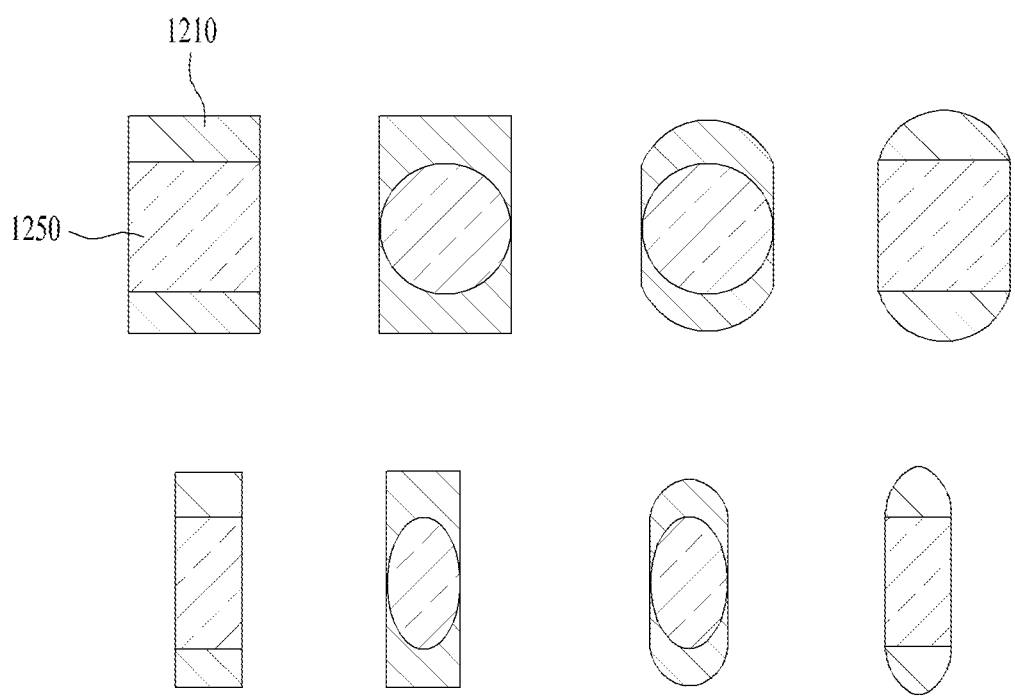
FIG. 13 shows plan views of various shapes that a vertical semiconductor light-emitting element in FIG. 12 may have.

FIG. 13 shows plan views of various shapes that the vertical semiconductor light-emitting element 1200 in FIG. 12 may have. The plan view is viewed from above in the direction in which the vertical semiconductor light-emitting element 1200 is stacked.

As shown in FIG. 13, the vertical semiconductor light-emitting element forms a mesa structure or a T-shaped structure in which the second semiconductor layer and the second electrode 1250 protrude from the first semiconductor layer 1210.

For example, the mesa may be a square or a rectangle having a width and a length equal to or smaller than 20 µm. Further, the mesa may have various shapes, such as a circle or an ellipse having a diameter equal to or smaller than 20 µm.

When growing the vertical semiconductor light-emitting element 1200 on the wafer, a shape as shown in FIG. 13 may be obtained by utilizing dry etching or wet etching.

However, the present disclosure may not be limited to the T-shaped structure or the mesa structure represented as an embodiment, and as described above, various structures other than the T-shape may be derived through adjustment of the value of the longitudinal length X.

Figure 14:
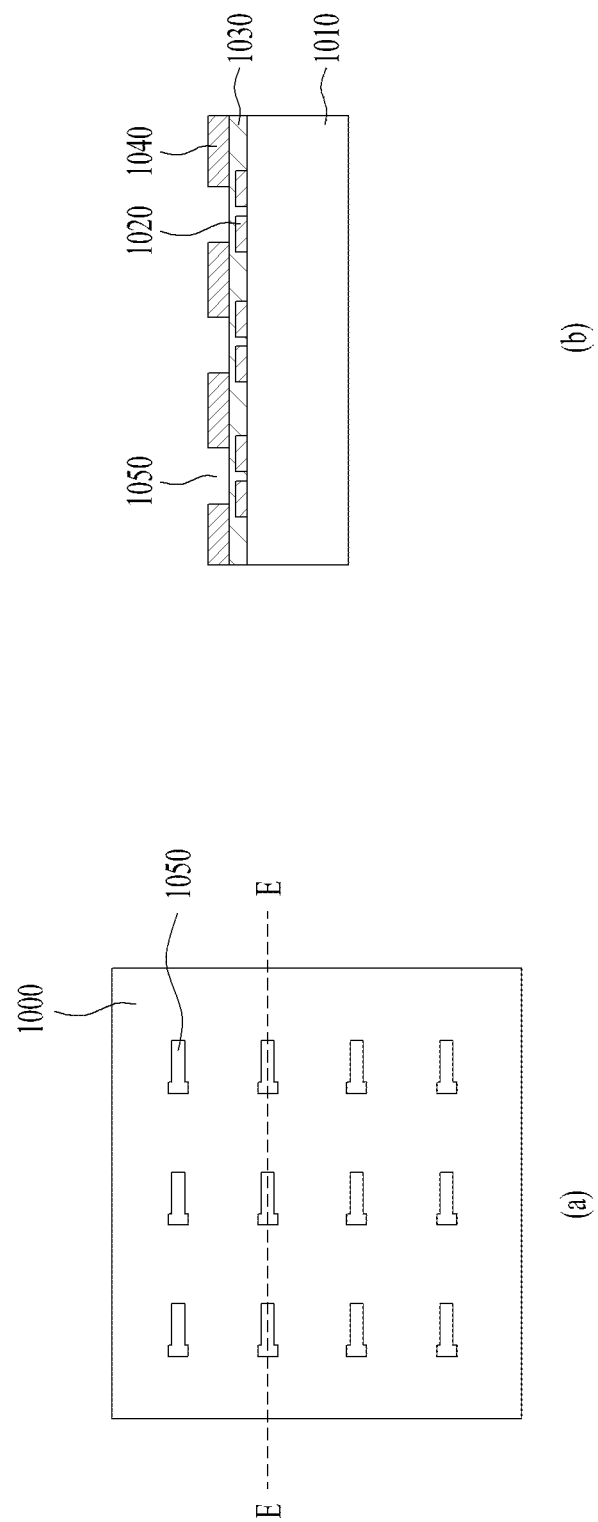
FIG. 14 shows a plan view and a cross-sectional view of a substrate having an assembly groove in FIG. 10 defined thereon.

FIG. 14 shows a plan view and a cross-sectional view of the substrate 1000 having the assembly groove in FIG. 10 defined thereon.

The assembly groove 1050 defined by the partition wall 1040 has a T-shape. This structure corresponds to the shape of the side face of the vertical semiconductor light-emitting element 1200 in FIG. 12.

(b) in FIG. 14 is a cross-sectional view taken along a line E-E in (a) in FIG. 14. The assembly electrode and the insulating layer 1030 are formed on the substrate 1010, and the partition wall 1040 is located thereon.

A width of the assembly groove 1050 defined by the partition wall 1040 is slightly greater than a width of the assembly face of the vertical semiconductor light-emitting element. For example, a difference between the width of the assembly groove 1050 and the width of the assembly face of the vertical semiconductor light-emitting element may be equal to or smaller than 3 µm. When the difference in width is too small, precision of the assembly position may be increased, but it takes a long time for the vertical semiconductor light-emitting element to be assembled into the assembly groove 1050. When the numerical value was adopted, favorable results were obtained experimentally.

A height of the partition wall 1040 or a depth of the assembly groove 1050 is, for example, in a range within twice the fixed transverse length Y represented in FIG. 12.

When the height of the partition wall 1040 is too great, the vertical semiconductor light-emitting element may be trapped in the assembly groove 1050 even at a position other than the assembly face 1260 of the vertical semiconductor light-emitting element.

Therefore, for example, the height of the partition wall 1040 is preferably equal to or smaller than 500 nm.

Figure 15:
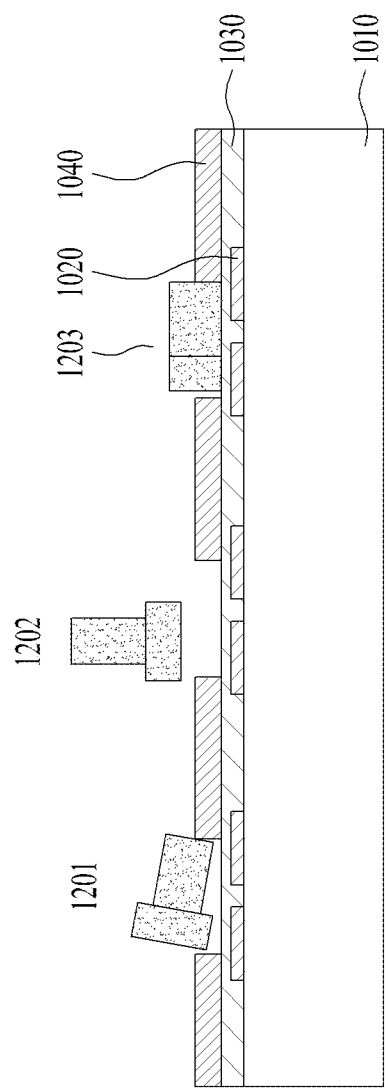
FIG. 15 is a diagram schematically showing an assembly process of a vertical semiconductor light-emitting element in FIG. 12 on a substrate having an assembly groove in FIG. 10 defined thereon.

FIG. 15 is a diagram schematically showing an assembly process of the vertical semiconductor light-emitting element 1200 in FIG. 12 on the substrate 1000 having the assembly groove in FIG. 10 defined thereon.

When the vertical semiconductor light-emitting element 1200 is assembled with the face other than assembly face 1260, there is a high probability that the defects will occur in the subsequent process. It was experimentally identified that the vertical semiconductor light-emitting element 1200 should be assembled only with the assembly face and not with the remaining faces.

As shown in FIG. 15, it may be seen that a vertical semiconductor light-emitting element 1201 is not precisely assembled into the assembly groove when attempting to assemble the vertical semiconductor light-emitting element 1201 with a face other than the flat assembly face 1260 of side faces thereof.

Further, even when the vertical semiconductor light-emitting element has a flat face, the vertical semiconductor light-emitting element is not able to be stably assembled into the assembly groove when a structure of the flat face does not correspond to the assembly groove.

For example, a face on which a first semiconductor layer of a vertical semiconductor light-emitting element 1202 is located is flat, but is considerably smaller than the assembly groove, so that it is difficult to fix the vertical semiconductor light-emitting element 1202 because the DEP force does not work strongly.

The reason may be found in the principle of the self-assembly scheme used in the present disclosure. In the self-assembly scheme of the present disclosure, the substrate is located at an upper portion of the fluid, and the assembly groove is located at a lower portion of the fluid, that is, faces the ground. Therefore, even when the semiconductor light-emitting element is attracted to the substrate by the magnetic field, when the DEP force acting on the element is not strong, the element is not fixed in the assembly groove of the substrate and returns into the fluid by gravity.

Again, referring to FIG. 15, when an assembly face of side faces of a vertical semiconductor light-emitting element 1203 is seated in the assembly groove of the substrate, the vertical semiconductor light-emitting element 1203 may be easily fixed by the DEP force.

Figure 16:
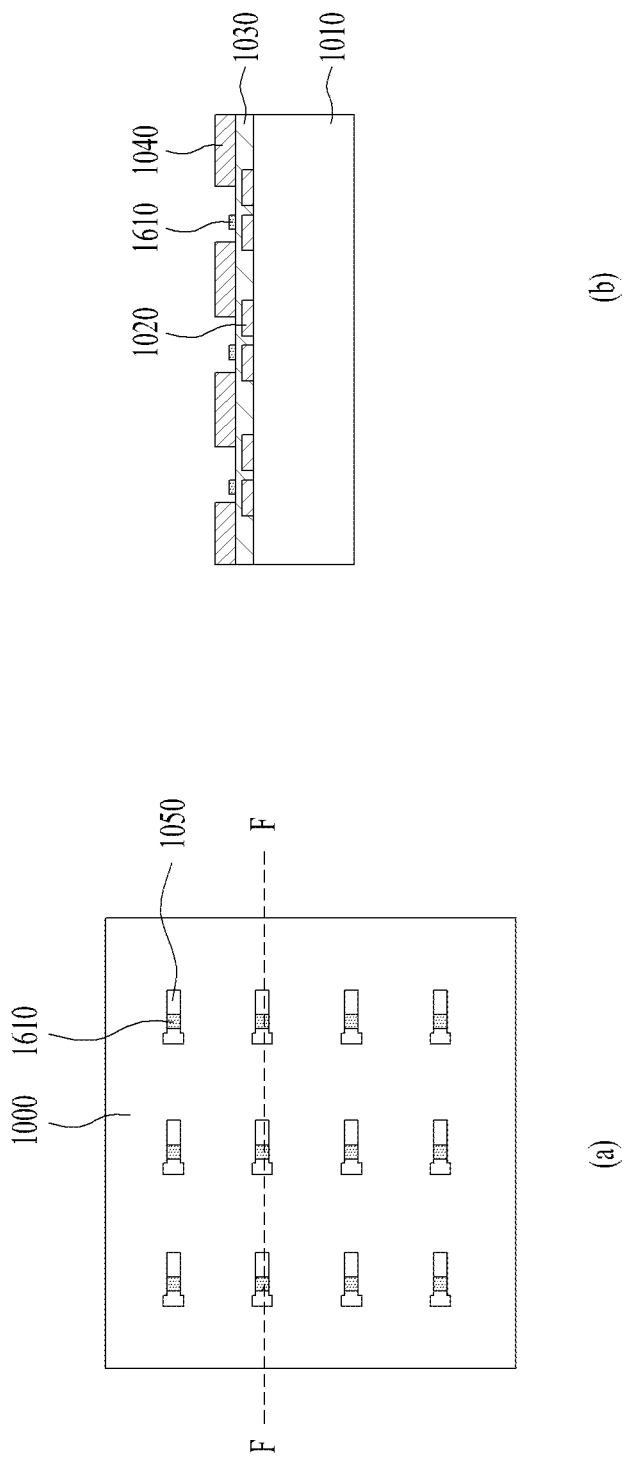
FIG. 16 is a diagram in which an adhesive layer for fixing a vertical semiconductor light-emitting element is included on a substrate having an assembly groove in FIG. 10 defined thereon.

FIG. 16 is a diagram in which an adhesive layer 1610 for fixing the vertical semiconductor light-emitting element 1200 is included on the substrate 1000 having the assembly groove in FIG. 10 defined thereon.

The adhesive layer 1610 may be made of, for example, an organic material such as polydimethylsiloxane (PDMS), polyethylene terephthalate (PET), or a polyurethane film.

As described above, in one embodiment of the present disclosure, the vertical semiconductor light-emitting element 1200 is assembled into and fixed in the assembly groove 1050 with the scheme of the electromagnetic field, so that the vertical semiconductor light-emitting element 1200 is not physically or chemically assembled.

Accordingly, problems such as movement or deviation of the vertical semiconductor light-emitting element by an external impact or the like may occur in the assembly process and the subsequent process.

As shown in FIG. 16, by positioning the adhesive layer 1610 inside the assembly groove 1050, the vertical semiconductor light-emitting element after the self-assembly may be stably fixed.

(a) in FIG. 16 is a plan view for indicating a position of the adhesive layer 1610, and (b) in FIG. 16 is a cross-sectional view taken along a line F-F in (a) in FIG. 16.

The adhesive layer 1610 is formed as thin as, for example, several hundred nm, and does not directly affect the DEP force acting by the assembly electrode 1020.

Figure 17:
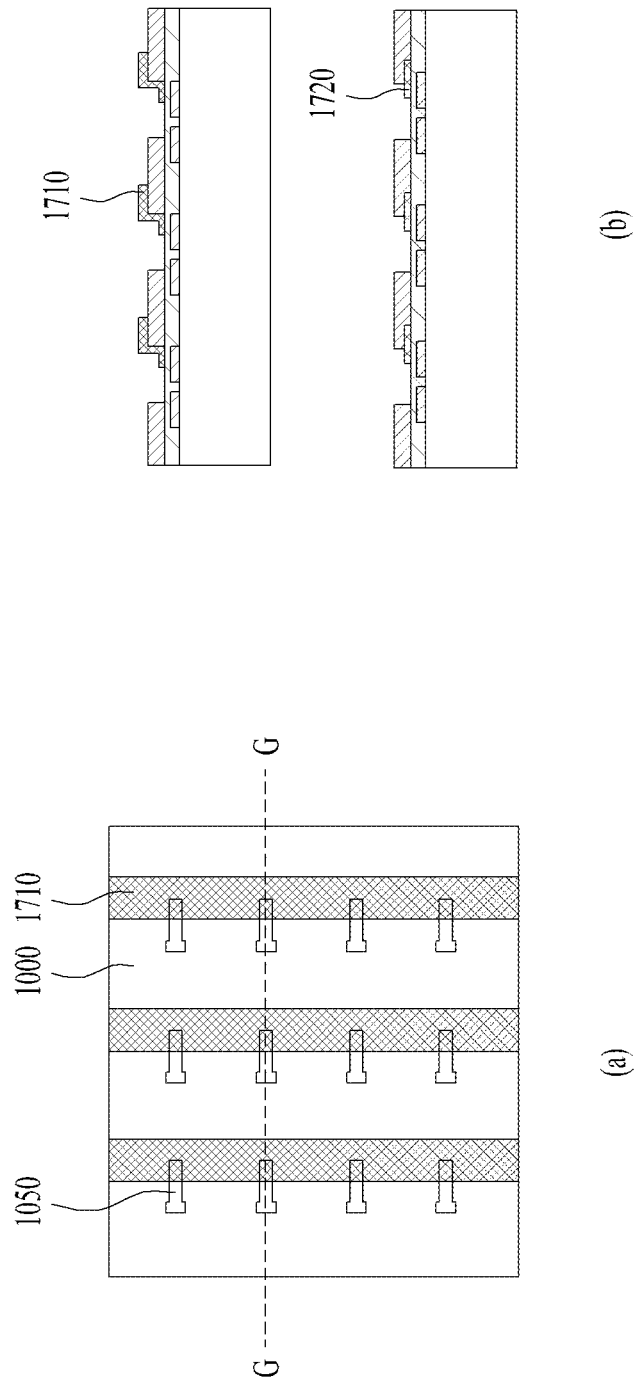
FIG. 17 is a view in which a reflective layer is included on top of a substrate having an assembly groove in FIG. 10 defined thereon.

FIG. 17 is a view in which a reflective film 1710 and 1720 is included on top of the substrate 1000 having the assembly groove in FIG. 10 defined thereon.

The reflective film 1710 and 1720 is formed at or near a portion where the active layer of the vertical semiconductor light-emitting element abuts against the assembly groove 1050.

As described above, the side face of the vertical semiconductor light-emitting element corresponds to the assembly face. Thus, when the vertical semiconductor light-emitting element is driven, light emitted from a side face of the active layer is implemented as a pixel.

In a case of a normal vertical semiconductor light-emitting element, light-emitting from a front face of the active layer is used. On the other hand, the present disclosure uses the light-emitting from the side face of the active layer, so that the reflective film 1710 and 1720 may be formed near the active layer in terms of maximizing light-emitting efficiency.

(a) in FIG. 17 is a plan view for indicating a position of the reflective film 1710 and 1720, and (b) in FIG. 17 is a cross-sectional view taken along a line G-G in (a) in FIG. 17.

As shown in (b) in FIG. 17, as a method of forming the reflective film, there is a method of applying the insulating layer, then forming the reflective film 1710, and then, forming the partition wall in the process of defining the assembly groove 1050 on the substrate.

As another method of forming the reflective film, there is a method of defining the assembly groove 1050 on the substrate, and then, forming the reflective film 1720 up to a portion where a portion of the bent partition wall and the active layer contact the assembly groove.

As the reflective film, for example, a metal reflective film such as silver (Ag) or aluminum (Al) may be used.

Separately from FIG. 17, in the present disclosure, it is possible to form an omni-directional reflective (ODR) layer without forming the reflective film. Compared with the metal reflective film, the ODR layer maintains high reflectivity for a wide angle of incidence.

The ODR layer generally has a structure of a semiconductor layer, a dielectric layer, and a metal layer. In the present disclosure, the ODR layer may be formed through a structure of the insulating layer that is in contact with the active layer, which is a light-emitting area of the vertical semiconductor light-emitting element, and the assembly electrode disposed underneath the insulating layer.

That is, when the semiconductor layer, the insulating layer, and the assembly electrode including the active layer 1220 are designed to be possible as the ODR layer, a reflection efficiency of light-emitting from the side face of the vertical semiconductor light-emitting element may be increased.

Figure 18:
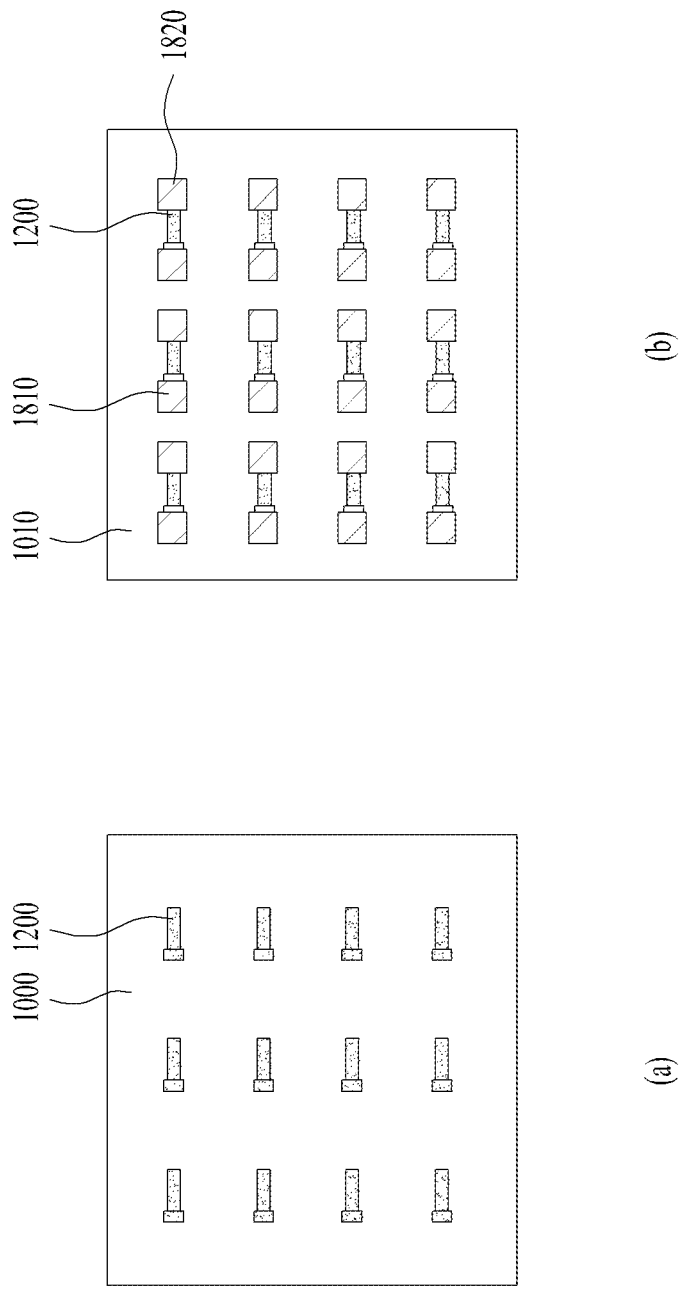
FIG. 18 is a view in which electrode pads are formed on top of a vertical semiconductor light-emitting element assembled according to an embodiment in FIGS. 10 and 12.

FIG. 18 is a view in which electrode pads 1810 and 1820 are formed on top of the vertical semiconductor light-emitting element 1200 assembled according to an embodiment in FIGS. 10 and 12.

The electrode pad may be further subjected to a wiring process of connecting a metal wiring thereafter, or may be used to be connected to a corresponding wiring through a pre-prepared wiring substrate.

(a) in FIG. 18 is a plan view of the vertical semiconductor light-emitting element 1200 assembled on the substrate 1000 having the assembly groove defined thereon, and (b) in FIG. 18 is a plan view in which a first electrode pad and a second electrode pad are formed after the assembly.

In the vertical semiconductor light-emitting element 1200, the first semiconductor layer and the second semiconductor layer are arranged in a line in the horizontal direction in the substrate while having directionality. Thus, the first electrode pad 1810 is for electrically connecting the first semiconductor layer, and the second electrode pad 1820 is for electrically connecting the second semiconductor layer.

Further, the first electrode pad 1810 and the second electrode pad 1820 may be formed only by one photo process.

For example, after the vertical semiconductor light-emitting element 1200 is assembled onto the substrate 1000 on which the assembly groove is defined, a planarization process may be performed on the element and the substrate. The planarization process is a process of forming a planarization layer. The planarization layer may be made of a photosensitive compound (PAC) or the like.

Thereafter, a partial area of the planarization layer may be removed to be exposed to the outside in order to electrically connect each of the first semiconductor layer and the second semiconductor layer to each wiring.

That is, a trench for forming a via electrode may be defined between the planarization layer and each semiconductor layer or an electrode formed on each semiconductor layer. In this case, an upper portion of the planarization layer has the same vertical level as each semiconductor layer or the electrode formed on each semiconductor layer according to the assembled structure of the present disclosure. Therefore, the trench may be defined by performing a single photo process and a single etching process.

On the other hand, in the case of the horizontal semiconductor light-emitting element, the photo process must be performed individually to form the n-type and p-type electrodes. Although the n-type and p-type semiconductor layers are located on the same plane, because the upper portion of the planarization layer and each semiconductor layer have different vertical levels, the photo process and the etching process for each of the planarization layer and each semiconductor layer may be performed.

Further, in the case of the horizontal semiconductor light-emitting element, during the electrode formation process, a spacing between the n-type and p-type electrodes becomes smaller as a size of the element decreases, increasing a risk of short circuit.

On the other hand, in the present disclosure, the spacing between the n-type and p-type electrodes may be proportional to the vertical length (in the stacked direction) of the vertical semiconductor light-emitting element. Therefore, a process margin corresponding to the vertical length may be more secured, thereby eliminating the problem such as the short circuit in the subsequent process.

Figure 19:
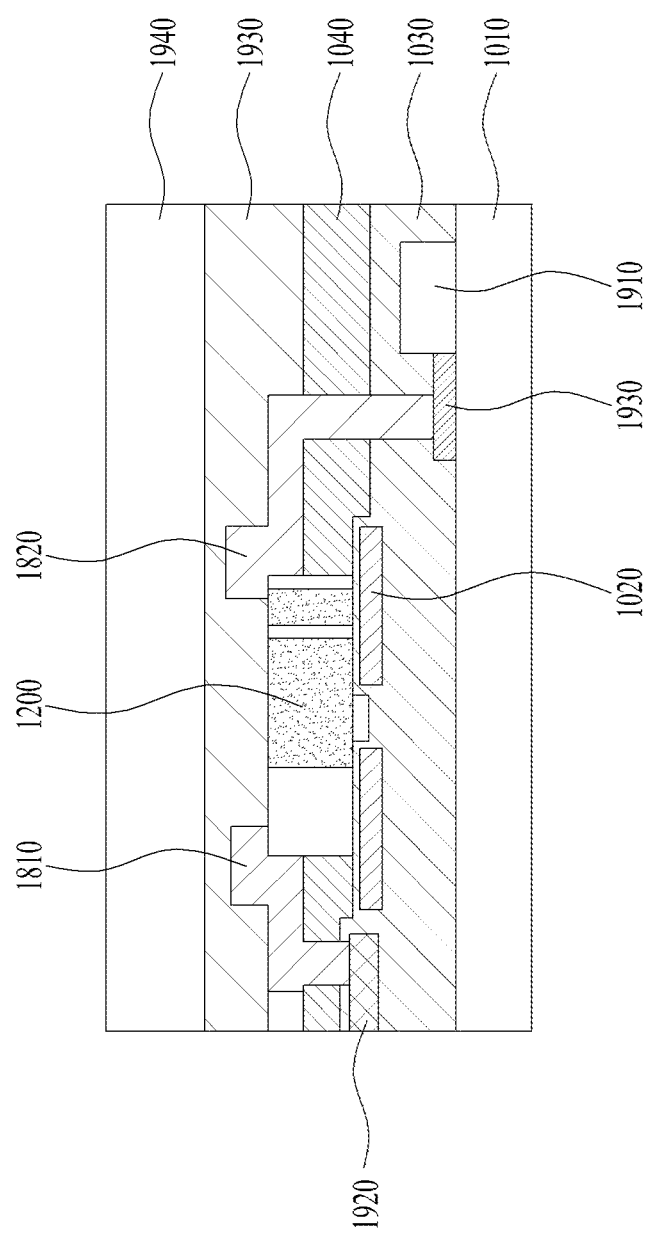
FIG. 19 is a cross-sectional view of a display device manufactured according to an embodiment in FIGS. 10 and 12.

FIG. 19 is a cross-sectional view of a display device manufactured according to an embodiment in FIGS. 10 and 12.

As the substrate having the assembly groove defined thereon according to the present disclosure, a donor substrate for transferring a light-emitting element to another substrate may be used, but a panel substrate for direct use in the display device may be used.

In a case of the panel substrate, a transistor 1910 for active matrix (AM) driving may be separately disposed, and a wiring line 1920 electrically connected to the first semiconductor layer, a wiring line 1930 for electrically connecting the second semiconductor layer to the transistor 1910, and the like may be disposed.

Accordingly, after the semiconductor light-emitting element is horizontally assembled on the panel substrate, the planarization process and the wiring process through the trench definition may be performed to manufacture the display device.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

The invention claimed is:

1. A method for manufacturing a display device, the method comprising:
    forming an assembly electrode on a substrate;
    applying an insulating layer on the assembly electrode;
    disposing a partition wall on the insulating layer;
    defining at least one assembly groove in the partition wall;
    providing at least one light emitting diode (LED) having an assembly face corresponding to a shape of the at least one assembly groove in the partition wall; and
    assembling the assembly face of the at least one LED into the at least one assembly groove in the partition wall,
    wherein the at least one LED includes a first electrode, a first semiconductor layer, an active layer, a second semiconductor layer, and a second electrode stacked in a first direction to form a stacked structure,
    wherein two opposing sides of the at least one LED are formed to have at least two longitudinal lengths, creating two flat assembly faces that correspond to a bottom surface of the at least one assembly groove, and
    wherein the at least one LED is seated in the at least one assembly groove using one of the two flat assembly faces formed on the two opposing sides, and the at least one assembly groove is configured to accommodate a single LED.

2. The method of claim 1, wherein the assembling the assembly face of the at least one LED into the at least one assembly groove includes:
    contacting the assembly face of the at least one LED to the at least one assembly groove using an assembly device having a magnetic body; and
    assembling the assembly face of the at least one LED into the at least one assembly groove based on an electric field applied through the assembly electrode formed on the substrate.

3. The method of claim 1, wherein the forming the assembly electrode on the substrate includes:
    forming a plurality of assembly electrode portions spaced apart from each other to respectively overlap portions of the partition wall that are disposed on opposite sides of the at least one assembly groove, or forming a single assembly electrode portion to overlap a bottom face of the at least one assembly groove.

4. The method of claim 1, wherein the first semiconductor layer is an N-type GaN layer, and the second semiconductor layer is a P-type GaN layer.

5. The method of claim 1, wherein the at least one LED includes a magnetic layer.

6. The method of claim 1, wherein the substrate contains at least one of glass, a conductor, or flexible polymer materials.

7. The method of claim 1, wherein the defining the at least one assembly groove includes:
    forming a polymer adhesive layer on at least a portion of a bottom face of the at least one assembly groove for seating the assembly face of the at least one LED on the polymer adhesive layer.

8. The method of claim 1, wherein the defining the at least one assembly groove includes:
    forming a metal reflective film on at least a portion of a bottom face of the at least one assembly groove for seating the active layer of the at least one LED on the metal reflective film.

9. The method of claim 1, further comprising:
    simultaneously forming wiring electrodes electrically connected to the first electrode and the second electrode of the at least one LED, respectively.

10. The method of claim 1, wherein the at least one LED is a micro-LED having a micrometer size.

11. The method of claim 1, wherein the substrate is equipped with a transistor for active matrix driving.

12. The method of claim 1, wherein the at least one LED includes one of a red LED, a green LED, and a blue LED,
    wherein shapes of assembly faces of the red LED, green LED, and blue LED are formed differently from one another, and
    wherein shapes of assembly grooves for the red LED, green LED, and blue LED are formed according to the shapes of the assembly faces of the red LED, green LED, and blue LED, respectively.

13. A display device comprising:
    an assembly electrode disposed on a substrate;
    an insulating layer disposed on the assembly electrode;
    a partition wall disposed on the insulating layer;
    at least one assembly groove in the partition wall; and
    at least one light emitting diode (LED) assembled in the at least one assembly groove in the partition wall,
    wherein the at least one LED includes a first electrode, a first semiconductor layer, an active layer, a second semiconductor layer, and a second electrode stacked in a first direction to form a stacked structure, and
    wherein two opposing sides of the at least one LED are formed to have at least two longitudinal lengths, creating two flat assembly faces that correspond to a bottom surface of the assembly groove, and
    wherein the at least one LED is seated in the assembly groove using one of the two flat assembly faces formed on the two opposing sides, and the assembly groove is configured to accommodate a single LED.

14. The display device of claim 13, wherein layers of the stacked structure of the at least one LED are perpendicular to a bottom surface of the at least one assembly groove.

15. The display device of claim 13, wherein the assembly face has a shape substantially identical to a shape of the at least one assembly groove.

16. The display device of claim 13, wherein the at least one LED includes one of a red LED, a green LED, and a blue LED, wherein shapes of assembly faces of the red LED, green LED, and blue LED are formed differently from one another, and wherein shapes of assembly grooves for the red LED, green LED, and blue LED are formed according to the shapes of the assembly faces of the red LED, green LED, and blue LED, respectively.

* * * * *